(12) United States Patent
Peace

(10) Patent No.: US 6,893,505 B2
(45) Date of Patent: May 17, 2005

(54) APPARATUS AND METHOD FOR REGULATING FLUID FLOWS, SUCH AS FLOWS OF ELECTROCHEMICAL PROCESSING FLUIDS

(75) Inventor: Steven L. Peace, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 272 days.

(21) Appl. No.: 10/141,619

(22) Filed: May 8, 2002

(65) Prior Publication Data

US 2003/0217929 A1 Nov. 27, 2003

(51) Int. Cl.$^7$ ............................ B05C 5/00; C25D 17/00; F16K 31/126; G05D 16/00
(52) U.S. Cl. ................. 118/506; 204/275.1; 137/487.5; 137/488; 251/61.2; 251/282
(58) Field of Search ....................... 118/506; 204/275.1; 137/487.5, 488; 251/61.2, 282

(56) References Cited

U.S. PATENT DOCUMENTS

| | | |
|---|---|---|
| 1,526,644 A | 2/1925 | Pinney |
| 1,881,713 A | 10/1932 | Laukel |
| 3,664,933 A | 5/1972 | Clauss |
| 3,706,635 A | 12/1972 | Kowalski |
| 3,716,462 A | 2/1973 | Jensen |
| 3,878,066 A | 4/1975 | Dettke et al. |
| 3,897,041 A * | 7/1975 | Cowan .................. 251/61.1 |
| 3,930,963 A | 1/1976 | Polichette et al. |
| 4,000,046 A | 12/1976 | Weaver |
| 4,046,105 A | 9/1977 | Gomez |
| 4,134,802 A | 1/1979 | Herr |
| 4,271,859 A * | 6/1981 | Lawsing .................. 137/85 |
| 4,304,641 A | 12/1981 | Grandia et al. |

(Continued)

FOREIGN PATENT DOCUMENTS

| | | |
|---|---|---|
| WO | WO 00/02675 | 1/2000 |
| WO | WO-00/61498 | 10/2000 |
| WO | WO-00/61837 | 10/2000 |
| WO | WO-01/90434 | 11/2001 |
| WO | WO-01/91163 | 11/2001 |
| WO | WO-02/45476 | 6/2002 |
| WO | WO-02/97165 | 12/2002 |
| WO | WO-02/99165 | 12/2002 |

OTHER PUBLICATIONS

Lee, Tien–Yu Tom, "Application of a CFD Tool in Designing a Fountain Plating Cell for Uniform Bump Plating of Semiconductor Wafers," IEE Transactions on Components, Packaging, and Manufacturing Technology (Feb. 1996), vol. 19, No. 1, IEEE.

Ritter et al., "Two– Three–Dimensional Numberical Modeling of Copper Electroplating For Advanced ULSI Metallization," E–MRS Conference Symposium M. Basic Models to Enhance Reliability, Strabourg (France) 1999.

*Primary Examiner*—Roy King
*Assistant Examiner*—Harry D. Wilkins, III
(74) *Attorney, Agent, or Firm*—Perkins Coie LLP

(57) ABSTRACT

A method and apparatus for regulating fluid flows, such as flows of electrochemical processing fluids for processing microelectronic workpieces. The apparatus includes a valve body having an entrance port, an exit port, and a flow passage between the entrance and exit ports through which a first fluid flows. The valve body further includes a pressure chamber coupleable to a second fluid source and at least partially isolated from the flow passage. A regulator, movably disposed in the flow passage to change a flow area of the flow passage, has a first surface with a first projected area and a second surface with a second, larger, projected area, both of which are operatively coupled to the first fluid. A third surface of the regulator is operatively coupled to the second fluid. The regulator can adjust its position to maintain a constant or nearly constant first fluid flow rate as the fluid pressure at the entrance port changes.

17 Claims, 21 Drawing Sheets

U.S. PATENT DOCUMENTS

| | | | |
|---|---|---|---|
| 4,384,930 A | 5/1983 | Eckles | |
| 4,437,943 A | 3/1984 | Beck | |
| 4,473,091 A * | 9/1984 | Stoves | 137/219 |
| 4,500,394 A | 2/1985 | Rizzo | |
| 4,576,689 A | 3/1986 | Makkaev | |
| 4,634,503 A | 1/1987 | Nogavich | |
| 4,648,944 A | 3/1987 | George | |
| 4,779,641 A * | 10/1988 | Charm et al. | 137/238 |
| 4,781,800 A | 11/1988 | Goldman | |
| 4,828,654 A | 5/1989 | Reed | |
| 4,902,398 A | 2/1990 | Homstad | |
| 4,949,671 A | 8/1990 | Davis et al. | |
| 4,959,278 A | 9/1990 | Shimauchi | |
| 4,988,533 A | 1/1991 | Freeman | |
| 5,000,827 A | 3/1991 | Schuster | |
| 5,096,550 A | 3/1992 | Mayer | |
| 5,115,430 A | 5/1992 | Hahne | |
| 5,135,636 A | 8/1992 | Yee | |
| 5,138,973 A | 8/1992 | Davis | |
| 5,151,168 A | 9/1992 | Gilton | |
| 5,156,730 A | 10/1992 | Bhatt | |
| 5,209,817 A | 5/1993 | Ahmad | |
| 5,217,586 A | 6/1993 | Datta | |
| 5,256,274 A | 10/1993 | Poris | |
| 5,302,464 A | 4/1994 | Nomura | |
| 5,344,491 A | 9/1994 | Katou | |
| 5,368,711 A | 11/1994 | Poris | |
| 5,372,848 A | 12/1994 | Blackwell | |
| 5,376,176 A | 12/1994 | Kuriyama | |
| 5,391,285 A | 2/1995 | Lytle | |
| 5,472,502 A | 12/1995 | Batchelder | |
| 5,549,808 A | 8/1996 | Farooq | |
| 5,584,310 A | 12/1996 | Bergman et al. | |
| 5,597,460 A | 1/1997 | Reynolds | |
| 5,639,316 A | 6/1997 | Cabral | |
| 5,658,387 A | 8/1997 | Reardon et al. | |
| 5,681,392 A | 10/1997 | Swain | |
| 5,684,713 A | 11/1997 | Asada | |
| 5,723,028 A | 3/1998 | Poris | |
| 5,754,842 A | 5/1998 | Minagawa | |
| 5,871,626 A | 2/1999 | Crafts | |
| 5,882,498 A | 3/1999 | Dubin | |
| 5,908,543 A | 6/1999 | Matsunami | |
| 5,932,077 A | 8/1999 | Reynolds | |
| 5,989,397 A | 11/1999 | Laube | |
| 5,989,406 A | 11/1999 | Beetz | |
| 5,999,886 A | 12/1999 | Martin | |
| 6,027,631 A | 2/2000 | Broadbent | |
| 6,028,986 A | 2/2000 | Song | |
| 6,053,687 A | 4/2000 | Kirkpatrick et al. | |
| 6,074,544 A | 6/2000 | Reid | |
| 6,090,260 A | 7/2000 | Inoue | |
| 6,110,011 A | 8/2000 | Somekh et al. | |
| 6,110,346 A | 8/2000 | Reid | |
| 6,136,163 A | 10/2000 | Cheung et al. | |
| 6,139,712 A | 10/2000 | Patton et al. | |
| 6,151,532 A | 11/2000 | Barone | |
| 6,156,167 A | 12/2000 | Patton | |
| 6,159,354 A | 12/2000 | Contolini | |
| 6,161,572 A * | 12/2000 | Credle et al. | 137/504 |
| 6,162,344 A | 12/2000 | Reid | |
| 6,179,983 B1 | 1/2001 | Reid | |
| 6,193,859 B1 | 2/2001 | Contolini | |
| 6,199,301 B1 | 3/2001 | Wallace | |
| 6,228,232 B1 | 5/2001 | Woodruff | |
| 6,277,263 B1 | 8/2001 | Chen | |
| 6,386,509 B1 * | 5/2002 | Mastuzawa et al. | 251/61.3 |
| 6,391,166 B1 | 5/2002 | Wang | |
| 6,497,801 B1 | 12/2002 | Woodruff | |
| 6,623,609 B2 | 9/2003 | Harris | |
| 6,632,334 B2 | 10/2003 | Anderson | |
| 2001/0024611 A1 | 9/2001 | Woodruff | |
| 2001/0043856 A1 | 11/2001 | Woodruff | |
| 2002/0008037 A1 | 1/2002 | Wilson | |
| 2002/0032499 A1 | 3/2002 | Wilson | |
| 2002/0125141 A1 | 9/2002 | Wilson | |
| 2002/0139678 A1 | 10/2002 | Wilson | |
| 2003/0127337 A1 | 7/2003 | Hanson | |

* cited by examiner

APPARATUS AND METHOD FOR REGULATING FLUID FLOWS, SUCH AS FLOWS OF ELECTROCHEMICAL PROCESSING FLUIDS

CROSS-REFERENCE TO RELATED APPLICATIONS

The present application relates to the following applications, all of which are incorporated herein by reference. Additional materials are incorporated by reference in other sections of this application.

1. U.S. patent application Ser. No. 10/080,914 titled METHOD AND APPARATUS FOR MANUALLY AND AUTOMATICALLY PROCESSING MICROELECTRONIC WORKPIECES, filed Feb. 22, 2002;

2. U.S. patent application Ser. No. 10/080,915 titled APPARATUS WITH PROCESSING STATIONS FOR MANUALLY AND AUTOMATICALLY PROCESSING MICROELECTRONIC WORKPIECES, filed Feb. 22, 2002;

3. U.S. patent application Ser. No. 09/875,300 titled TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES, filed Jun. 5, 2001;

4. U.S. patent application Ser. No. 10/080,910 titled MICROELECTRONIC WORKPIECE TRANSFER DEVICES AND METHODS OF USING SUCH DEVICES IN THE PROCESSING OF MICROELECTRONIC WORKPIECES, filed Feb. 22, 2002; and 5. Published PCT Application No. PCT/US99/14414, titled AUTOMATED SEMICONDUCTOR PROCESSING SYSTEM, filed Jun. 25, 1999.

TECHNICAL FIELD

The present invention is directed generally to methods and apparatuses for regulating fluid flows, such as flows of electrochemical processing fluids.

BACKGROUND

Microelectronic devices, such as semiconductor devices and field emission displays, are generally fabricated on and/or in microelectronic workpieces using several different types of machines ("tools"). Many such processing machines have single or multiple processing stations that perform one or more procedures on the workpieces. For example, some existing machines include a plurality of electrochemical processing chambers, each of which is configured to contact a microelectronic workpiece with an electrochemical processing fluid to deposit material (such as an electrically conductive material) on the microelectronic workpiece.

One characteristic of both single and multiple processing station tools is that the rates and efficacies of processes performed in the chambers are dependent upon the flow rate of electrochemical processing fluid into the chambers. One problem with this characteristic is that the flow rate of fluid into the processing chambers can fluctuate. For example, existing electrochemical processing chambers typically include an in-line filter to remove impurities from the electrochemical processing fluid. As the filter accumulates particulates and other contaminates, the pressure of the fluid exiting the filter decreases, as does the fluid flow rate. As the fluid flow rate decreases, rate-dependent processes, such as the rate at which material is deposited onto the microelectronic workpiece, also decrease, which can lead to undesirable variations in the processed workpieces.

SUMMARY

The present invention is directed toward apparatuses and methods for regulating fluid flows, such as the flows of electrochemical processing fluids. In one aspect of the invention, a valve regulates the fluid flow by maintaining a constant or nearly constant flow rate, despite drops in upstream pressure. Accordingly, downstream rate-dependent processes, such as electrochemical deposition processes, are unaffected by even substantial upstream pressure drops.

One aspect of several embodiments of the invention includes directing the fluid flows into a valve having a cavity and a movable regulator positioned within the cavity. The regulator is positioned to change a flow area of the valve as the regulator moves, and is shaped and sized so that a relatively large pressure drop at the entrance of the valve causes the regulator to adjust its position and maintain an approximately constant fluid flow rate through the valve. For example, the regulator can have a relatively small surface area facing toward an entrance of the valve and a relatively large surface area facing away from the entrance of the valve. The difference in the surface areas causes the regulator to reach an equilibrium position at a point where the flow rate through the valve remains approximately constant, even as the pressure of the fluid entering the valve drops by a substantial amount. The valve can also include a pressure chamber coupled to a source of another fluid (such as a source of pressurized air) to pre-set the regulator at a position that produces the desired flow rate. In one mode of operation, the pressure in the pressure chamber can also be adjusted as the pressure of the fluid upstream of the valve decreases, providing another degree of freedom by which to maintain a constant flow rate through the valve.

The valve can be installed in a variety of contexts in which it is desirable to maintain an approximately constant flow rate despite pressure fluctuations in the fluid flow. For example, the flow valve can be positioned in-line with an electrolytic or electroless processing chamber of a tool configured for processing microelectronic workpieces. In other embodiments, the valve can be positioned in-line with other chambers of the tool, for example, spray/rinse chambers and/or material removal chambers or capsules. A controller can regulate the flow to each of the chambers, and each of the chambers can be accessible either manually or by an automatic robot.

BRIEF DESCRIPTION OF THE DRAWINGS

FIGS. 10A–E are partially schematic illustrations of portions of microelectronic workpieces having conductive material disposed thereon in accordance with embodiments of the invention.

DETAILED DESCRIPTION

The following description discloses the details and features of several embodiments of apparatuses for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1–23.

Figure 1:
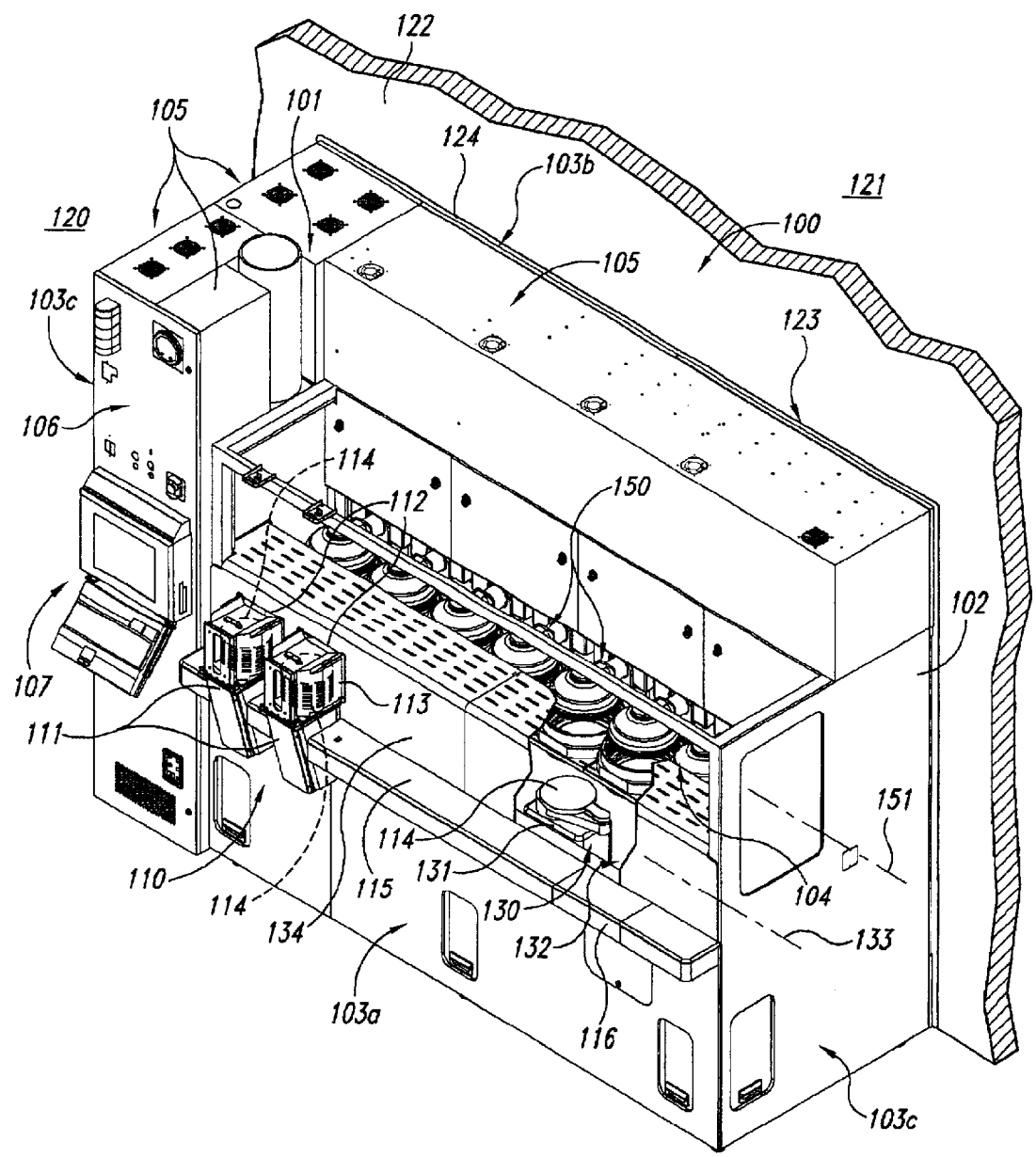
FIG. 1 is a partially cutaway, isometric view of an apparatus configured to both manually and automatically process microelectronic workpieces in chambers receiving fluid that is regulated in accordance with an embodiment of the invention.
Figure 2:
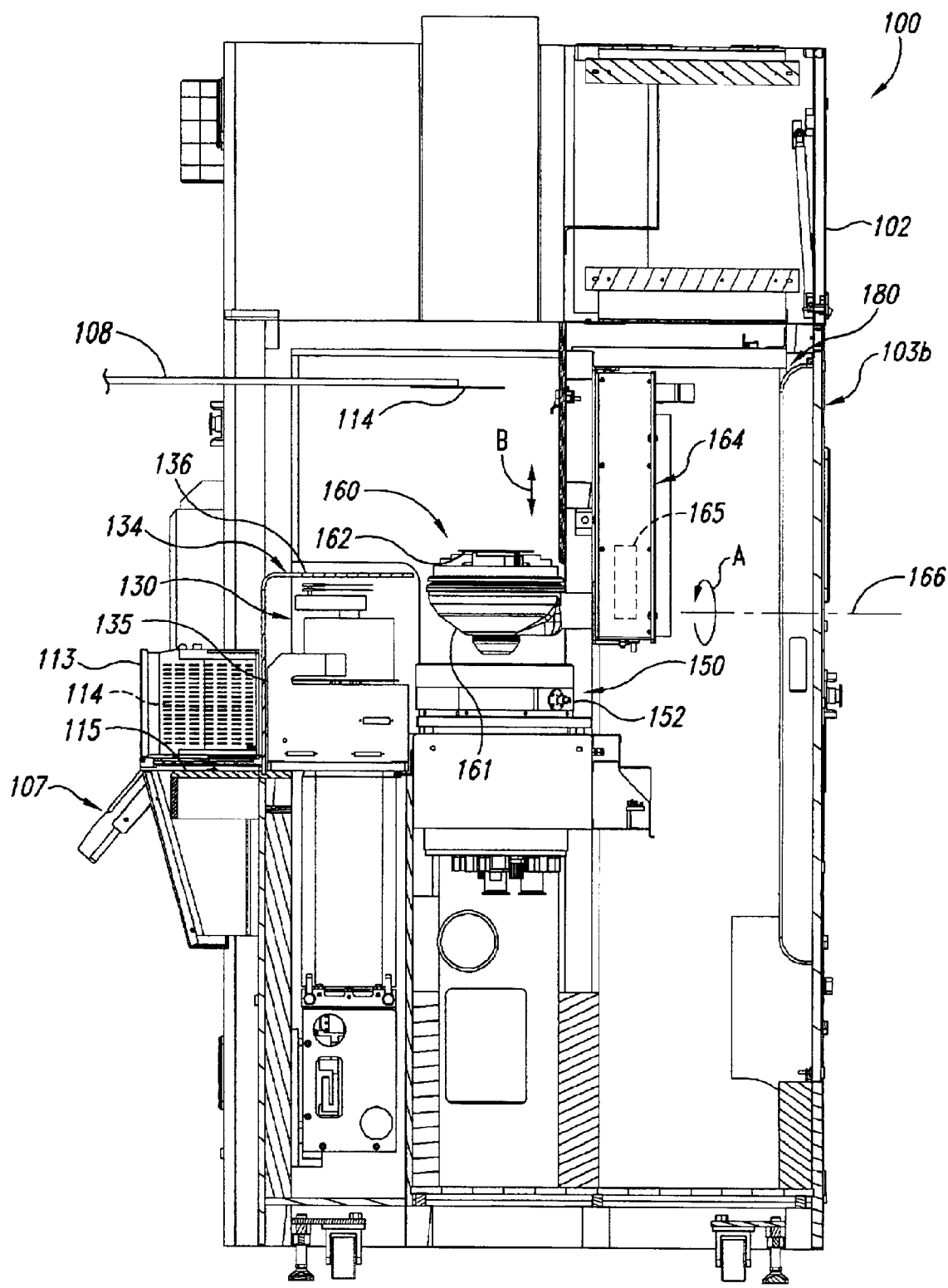
FIG. 2 is a partially schematic, cross-sectional side view of an apparatus generally similar to that shown in FIG. 1 with a support positioned to manually receive a microelectronic workpiece in accordance with an embodiment of the invention.
Figure 3:
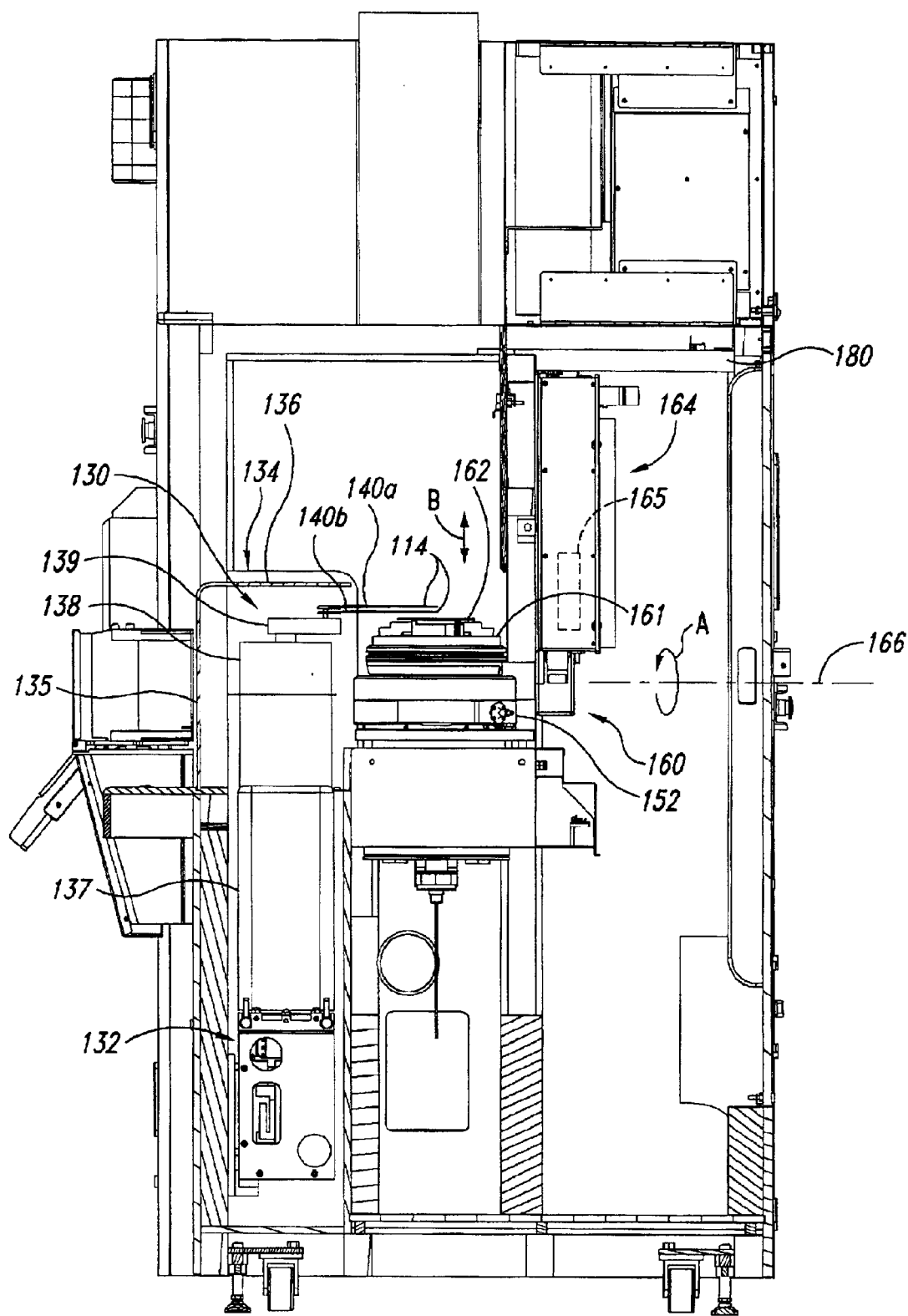
FIG. 3 is a partially schematic, cross-sectional side view of an apparatus generally similar to that shown in FIGS. 1 and 2 with the support positioned to receive microelectronic workpieces from an automated transfer device in accordance with an embodiment of the invention.
Figure 4:
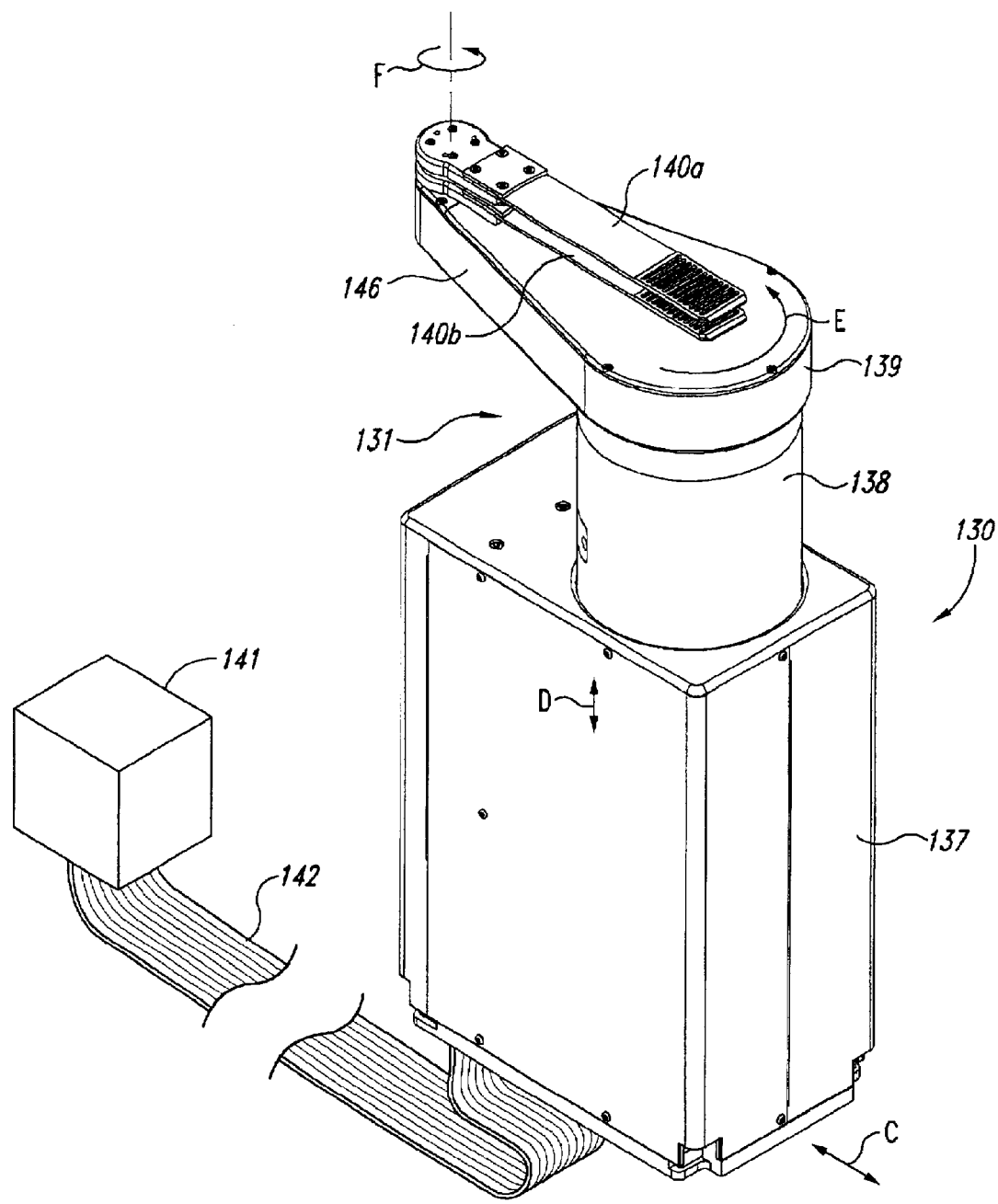
FIG. 4 is an isometric view of a portion of an automated transfer device in accordance with an embodiment of the invention.
Figure 5:
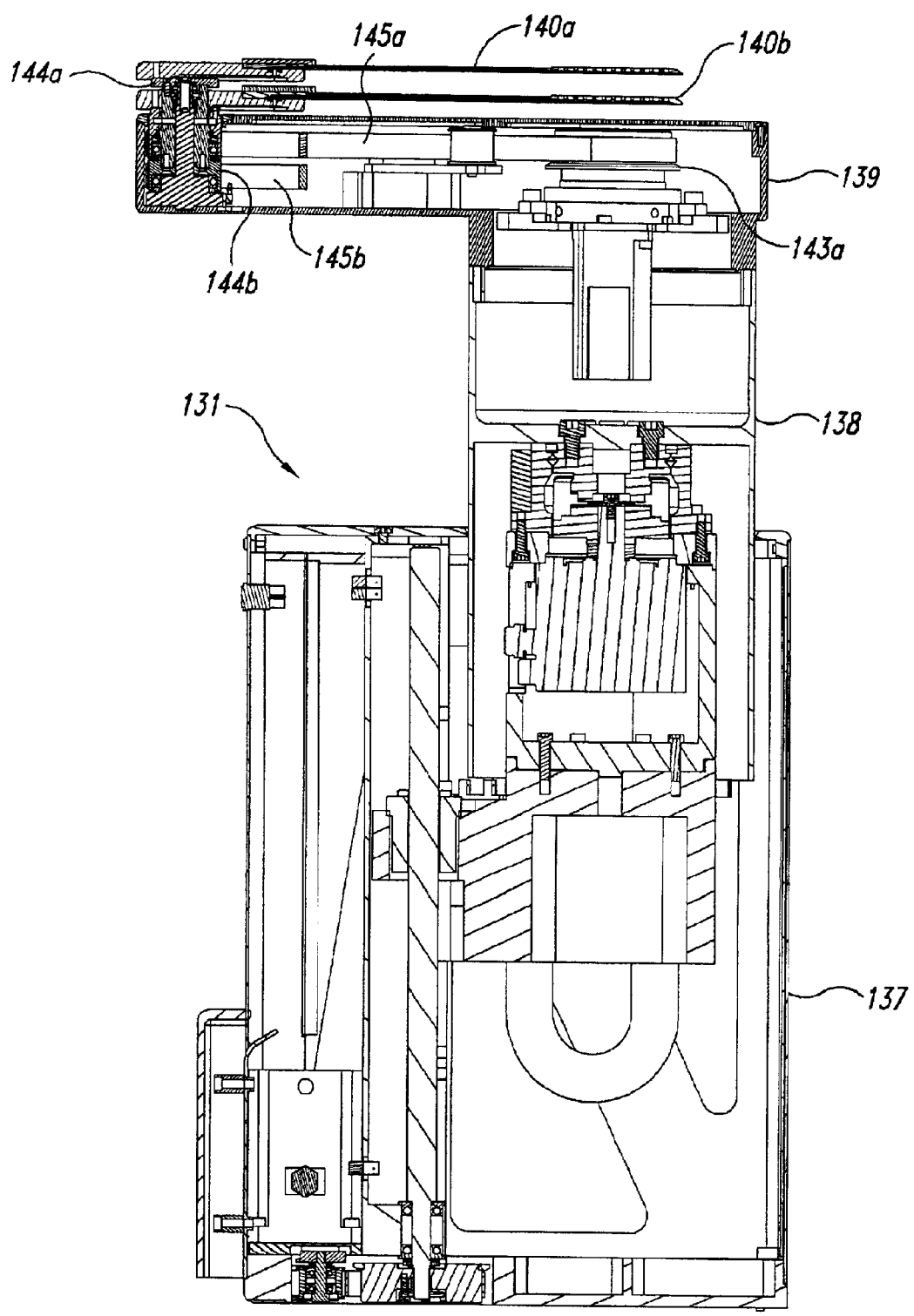
FIG. 5 is a partially schematic, cross-sectional side view of the automated transfer device shown in FIG. 4 taken substantially along line 5—5.
Figure 6:
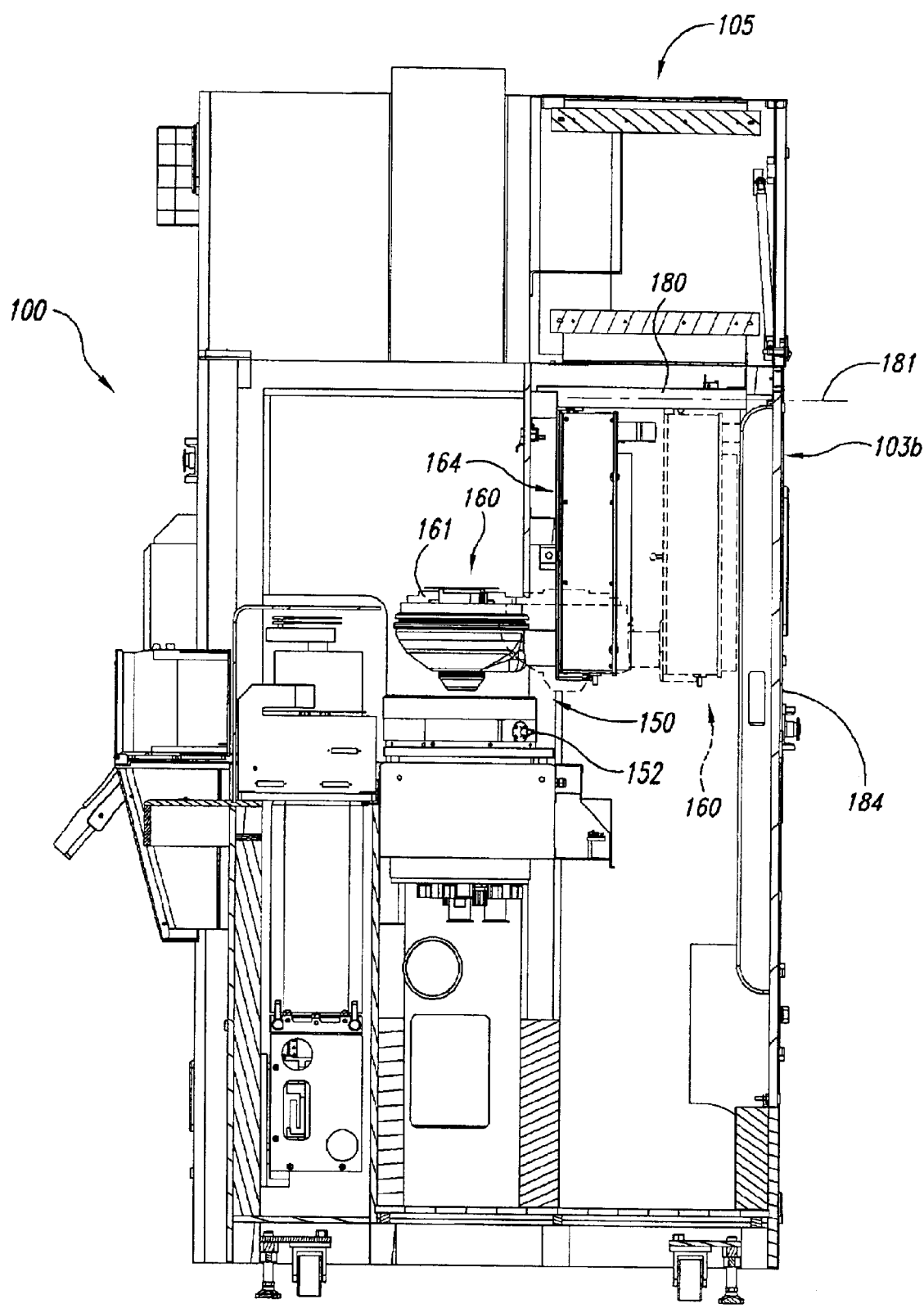
FIG. 6 is a partially schematic, cross-sectional side view of an apparatus generally similar to that shown in FIG. 1 with the support movable toward and away from a processing station in accordance with an embodiment of the invention.
Figure 7:
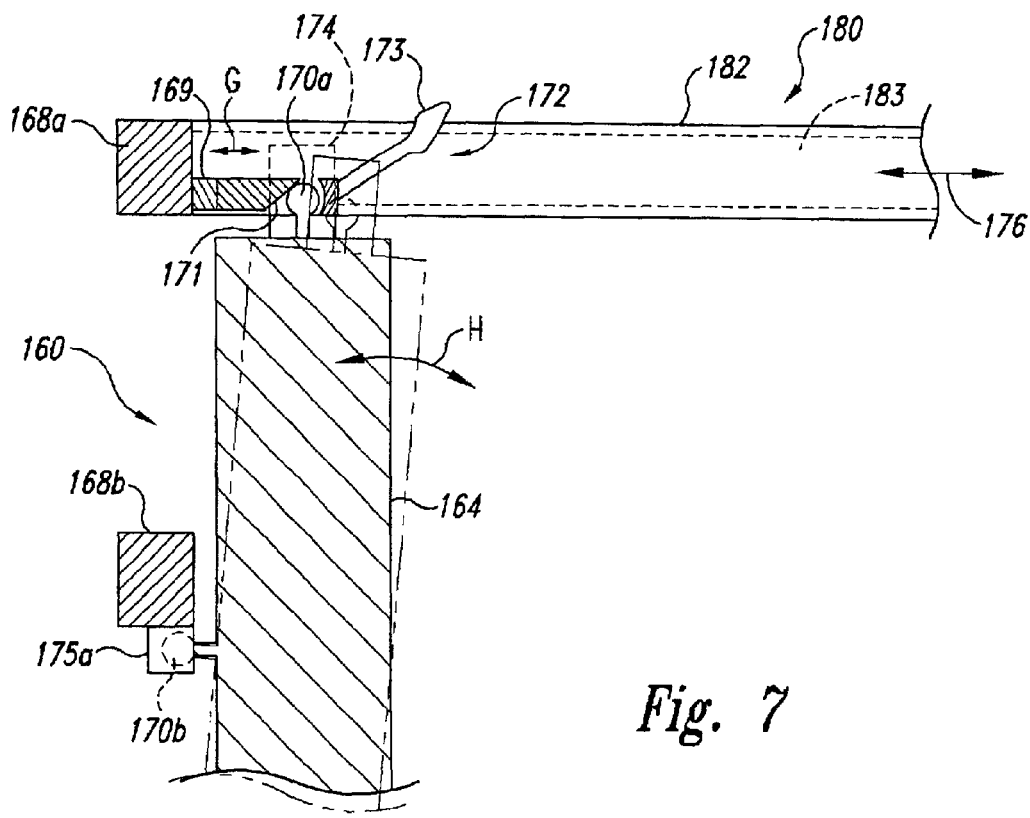
FIG. 7 is a partially schematic, cross-sectional side view of a portion of a support supported by a guide structure in accordance with an embodiment of the invention.
Figure 8:
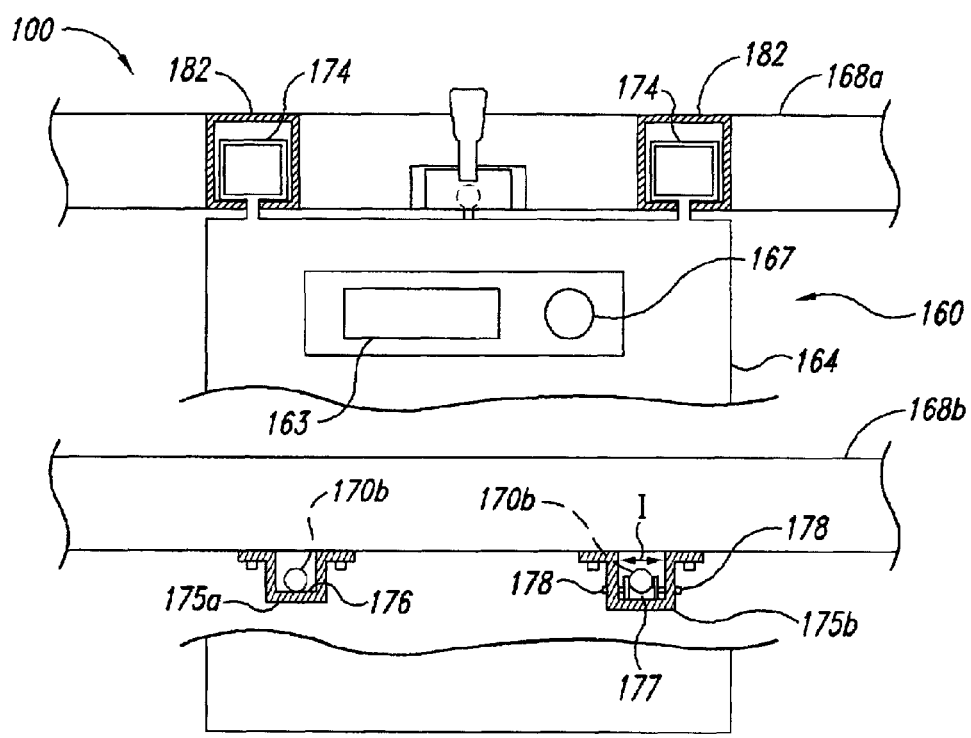
FIG. 8 is a partially schematic rear view of a portion of the support shown in FIG. 7 supported from the guide structure in accordance with an embodiment of the invention.

Section A (including FIGS. 1–8 and the associated discussion below) relate generally to apparatuses suitable for both manually and automatically processing microelectronic workpieces in accordance with several embodiments of the invention. More specifically, FIG. 1 is an overall view of one such apparatus and FIGS. 2–3 illustrate arrangements for manually and automatically transferring microelectronic workpieces to a support that positions the workpieces at a processing station of the apparatus. FIGS. 4–5 illustrate automatic workpiece transfer devices (such as robots), and FIGS. 6–8 illustrate arrangements for removably carrying the support from above the processing station.

Figure 9:
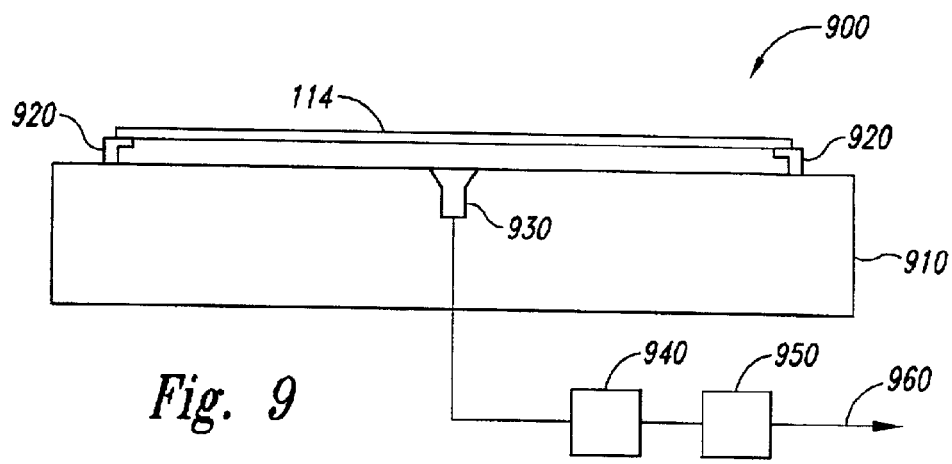
FIG. 9 is a schematic illustration of a metrology station in accordance with an embodiment of the invention.

Section B (FIGS. 9–18 and the associated discussion below) relate to processing stations that can be included in the apparatuses, and processes that can be completed at the stations. In one representative process, microelectronic workpieces can be evaluated at a metrology station (FIG. 9). Material can be applied to the workpieces and/or enhanced and/or repaired at an electrochemical deposition station (FIGS. 11–14) or an electroless deposition station (FIG. 15) to produce layers such as those shown in FIGS. 10A–10E. The workpieces can be bevel etched and cleaned at a capsule station (FIGS. 16A–B) and/or rinsed at a spray station (FIG. 17), and annealed in a thermal processing station (FIG. 18). In other embodiments, the apparatus can perform other processes and/or other process sequences.

Figure 19:
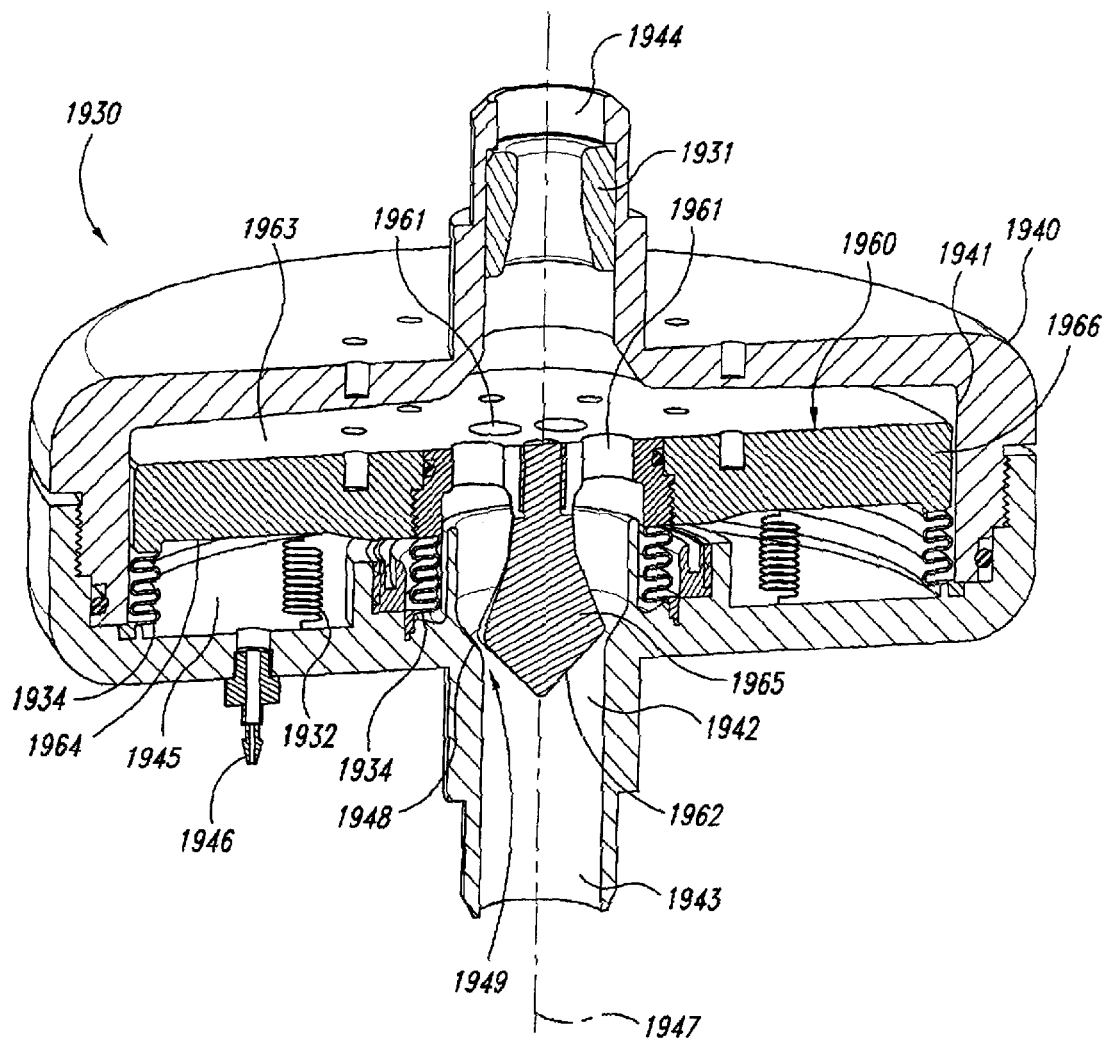
FIG. 19 is a partially schematic, partially cutaway isometric view of a flow valve in accordance with an embodiment of the invention.
Figure 20A:
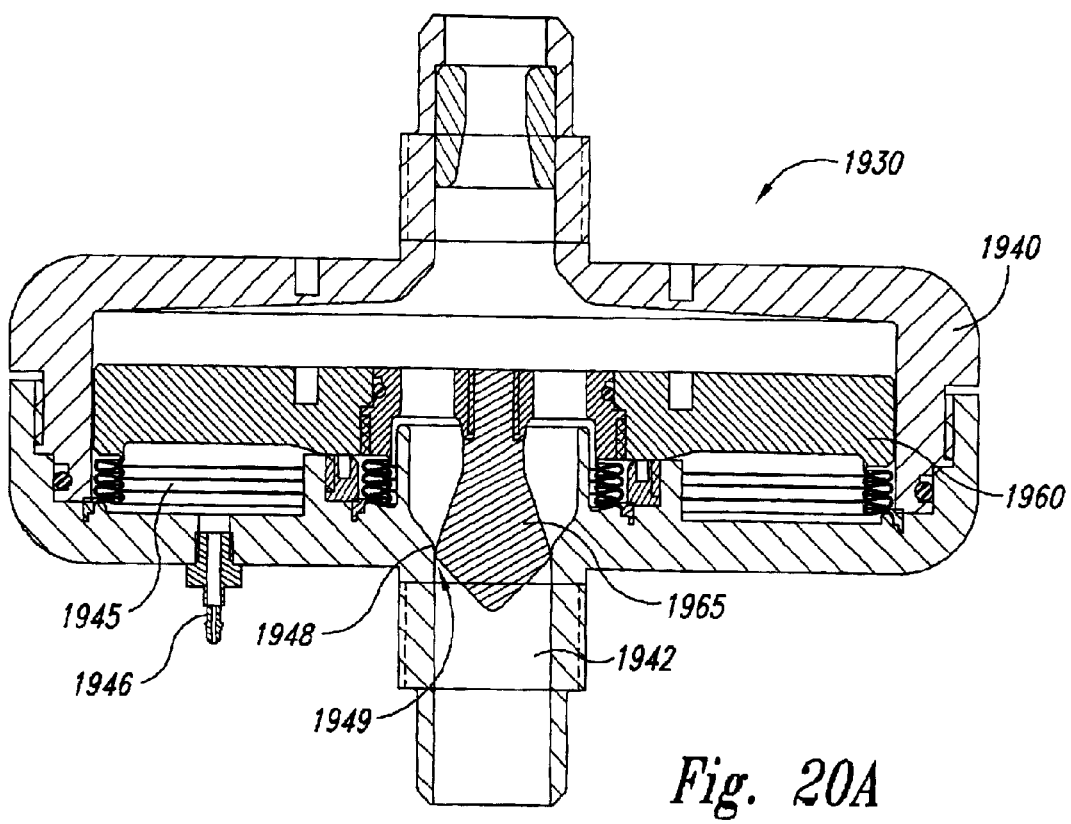
FIGS. 20A–20C are cross-sectional side views of an embodiment of the valve shown in FIG. 19 at three different settings.
Figure 20B:
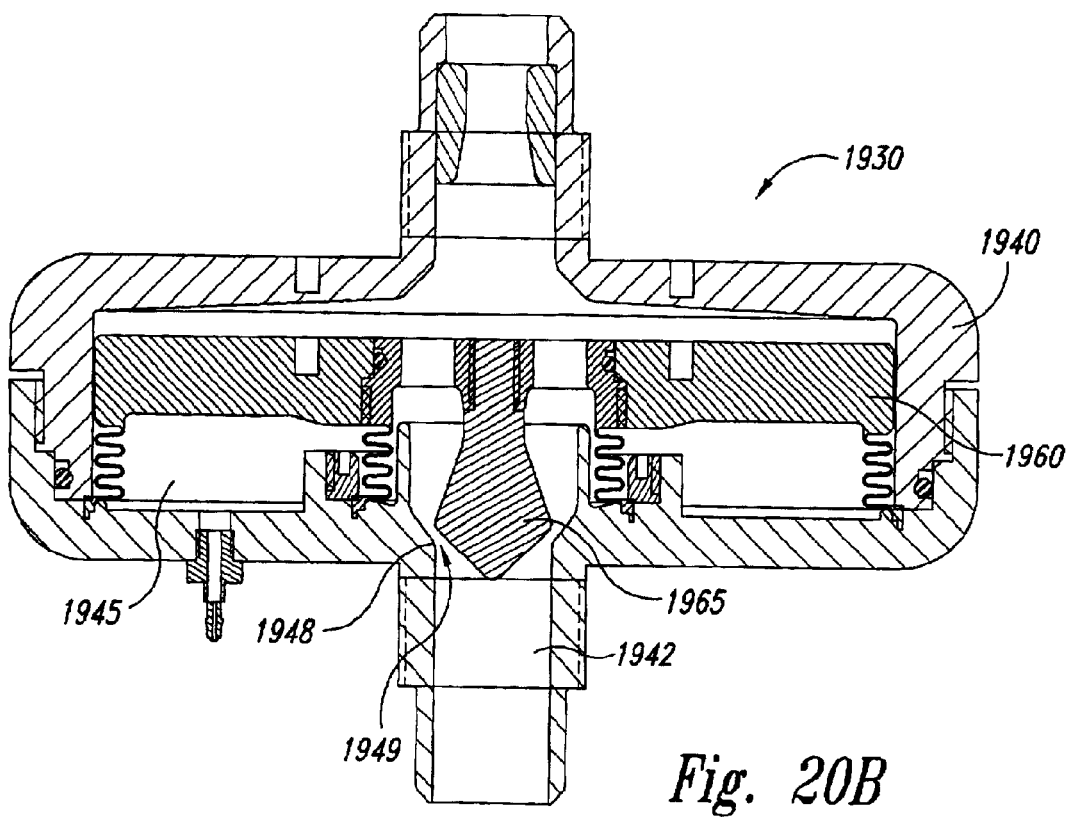
Figure 20C:
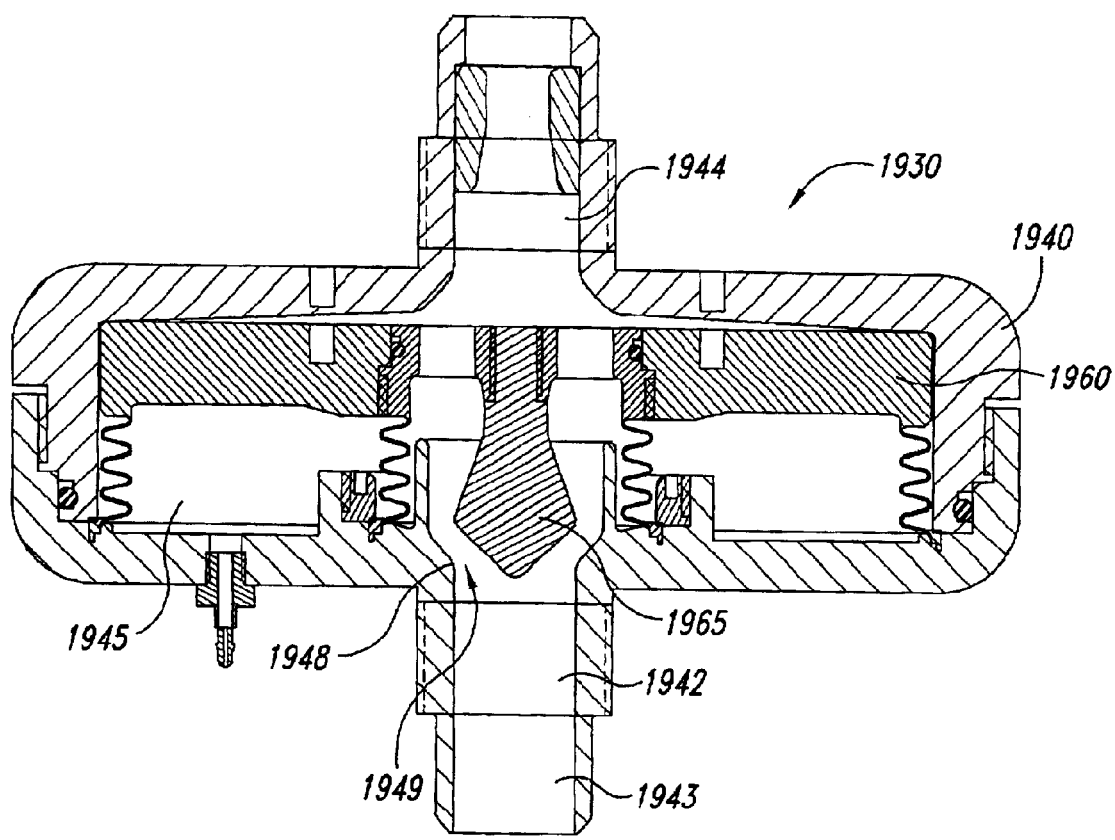
Figure 21:
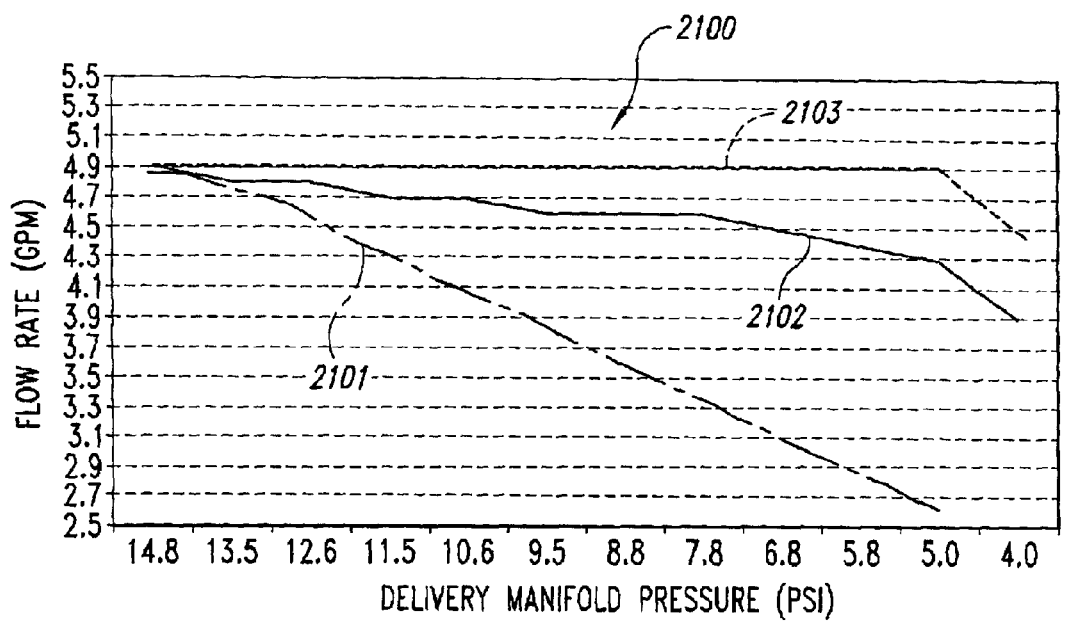
FIG. 21 is a graph illustrating the performance of a valve in accordance with an embodiment of the invention.
Figure 22:
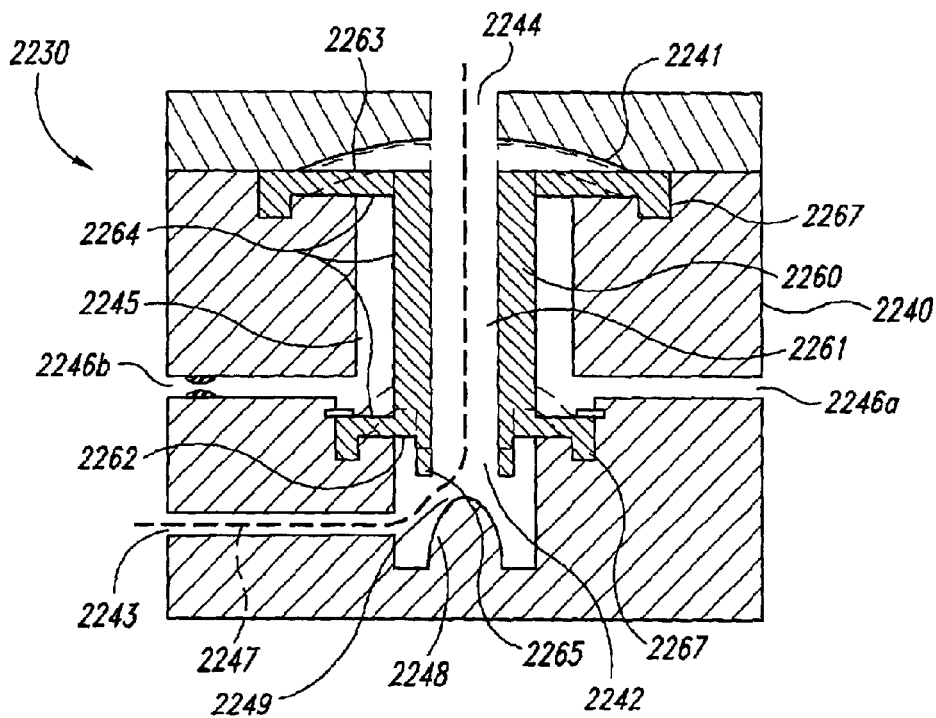
FIG. 22 illustrates another embodiment of a valve for controlling flow in accordance with another embodiment of the invention.
Figure 23:
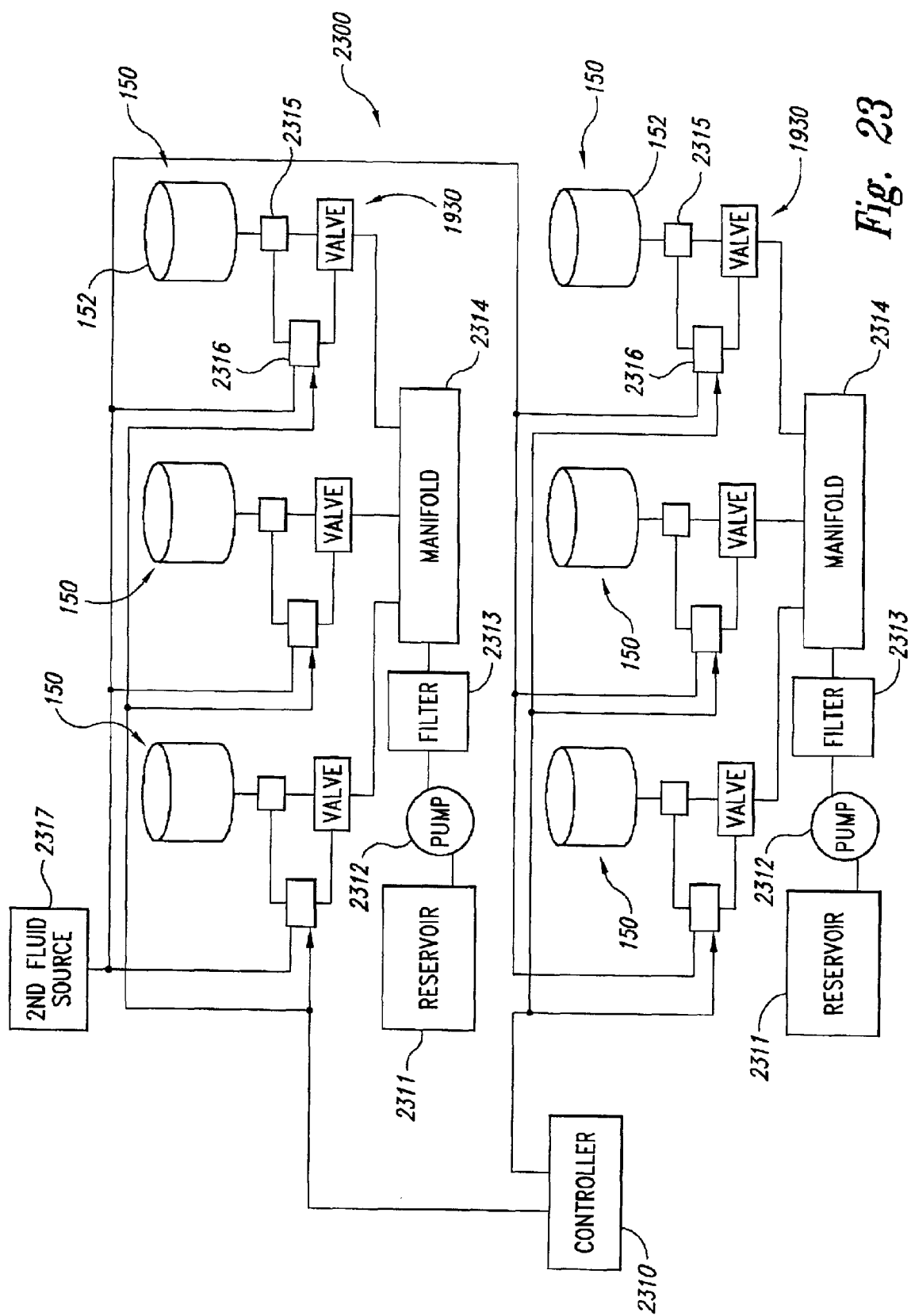
FIG. 23 is a block diagram illustrating an apparatus having flow valves in accordance with another embodiment of the invention.

Section C (FIGS. 19–23 and the associated discussion below) relate to flow valves suitable for use in a wide variety of installations, including processing stations such as those described with reference to FIGS. 11–17. More specifically, FIG. 19 is an isometric view of one such flow valve, FIGS. 20A–20C illustrate an embodiment of a flow valve at a variety of settings, and FIG. 21 illustrates performance characteristics for one such flow valve. FIG. 22 illustrates another such flow valve, and FIG. 23 is a schematic block diagram illustrating flow valves incorporated into an apparatus in accordance with an embodiment of the invention.

A. Apparatus for Manually and Automatically Processing Microelectronic Workpieces FIG. 1 is a partially cutaway isometric view of an apparatus 100 configured to both manually and automatically process microelectronic workpieces in accordance with an embodiment of the invention. In one aspect of this embodiment, the apparatus 100 is used in both a research and development setting and a production setting. For example, in a research and development setting, individual microelectronic workpieces are moved manually into and out of the apparatus 100 for experimenting with and demonstrating new methods and processes. The same apparatus 100 is also suitable for use in a production setting in which large numbers of microelectronic workpieces are automatically and efficiently moved into and out of the apparatus in a routine manner for processing. As described in greater detail below, the manual and automated processes occur sequentially or simultaneously using a single apparatus 100.

In one embodiment, the apparatus 100 includes a plurality of processing stations, each configured to perform one or more processes on the microelectronic workpieces. Some processing stations (such as the electrochemical deposition, electroless deposition, and capsule stations) include a vessel configured to provide a fluid in contact with the workpieces. A support carries the workpieces in contact with the fluid during processing. The workpieces are loaded onto the support either manually or with an automatic transfer device.

In one aspect of this embodiment, the apparatus 100 includes a chassis 101 carrying a plurality of processing stations 150. In one embodiment, the chassis 101 carries eight processing stations 150 (as shown in FIG. 1), or alternatively, the chassis 101 carries other numbers of processing stations 150 in other embodiments. The processing stations 150 are aligned along a station axis 151 which, in one embodiment, is generally straight. In other embodiments, the station axis 151 is curved (for example, in a horseshoe shape) or has other shapes. In any of these embodiments, microelectronic workpieces 114 may be loaded manually and/or automatically into the processing stations 150 depending upon the requirements for a particular station 150 at a particular point in time.

In one embodiment, the apparatus 100 includes an enclosure 102 disposed around some or all of the chassis 101 and the processing stations 150. The enclosure 102 has a plurality of surfaces, such as a front surface 103a, a rear surface 103b facing opposite from the front surface 103a, and two side surfaces 103c between the front surface 103a and the rear surface 103b. In one aspect of this embodiment, the front surface 103a is configured to face the user (not shown) and includes a graphical user interface 107 coupled to a processor 106 to control the operation of electrical units 105. The electrical units 105 in turn power and control the components of the apparatus 100.

In one embodiment, the front surface 103a also includes an input/output station 110 configured to support the microelectronic workpieces 114 for automatic transfer into and out of the processing stations 150. In one aspect of this embodiment, the input/output station includes two tilting platforms 111, each configured to support a container 113 that removably carries a plurality of the microelectronic workpieces 114. The tilting platforms 111 move from an outwardly tilted position (for receiving the containers 113) to an upright position (shown in FIG. 1). When the containers 113 are in the upright position, the microelectronic workpieces 114 within the containers 113 are accessible to an automated transfer device 130 through container access openings 112 in the enclosure 102.

In one embodiment, the automated transfer device 130 includes a robot 131 supported by a transfer device support 132. The robot 131 moves along a transfer device guide path 133 to remove the microelectronic workpieces 114 from the containers 113 and move the microelectronic workpieces 114 through the container access opening 112, into the enclosure 102 and to the processing stations 150. The transfer device 130 then returns the microelectronic workpieces 114 to the same or a different container 113 through the same or a different access opening 112.

In another aspect of this embodiment, the front surface 103a also includes a support surface 115 on which the containers 113 can be positioned for manual loading and unloading. In one aspect of this embodiment, the support surface 115 has a removable section 116 that allows for service access to the transfer device 130. In another embodiment, the transfer device 130 is accessed from other portions of the apparatus 100. In either embodiment, the user may place the containers 113 on the support surface 115 and then individually remove the microelectronic workpieces 114 from the container 113 and move them into the enclosure 102 through a manual access opening 104. Accordingly, in one aspect of these embodiments, the manual access opening 104 is large enough to allow the user to manually access any and all of the processing stations 150. In a further aspect of these embodiments, the manual access opening 104 is a single, contiguous opening. In another embodiment, the manual access opening 104 includes a plurality of smaller adjacent openings separated, for example, by vertical dividers that still allow the user to access all the processing stations 150. In one aspect of any of these embodiments, the manual access opening 104 is positioned on a single side (such as the front side) of the apparatus 100 so that the user may manually access all the processing stations 150 from one side of the apparatus 100.

In one embodiment, the manual access opening 104 is permanent. In another embodiment, the apparatus 100 includes a panel that is positioned over the manual access opening 104 to fully enclose the processing stations 150 and the transfer device 130, for example, during extended periods of exclusively automated processing. In a further aspect of this embodiment, the enclosure 102 defines a "mini" clean room environment. In one aspect of these embodiments, a shield 134 is positioned adjacent to the transfer device 130 to prevent interference between the transfer device 130 and the user when the user manually accesses the processing stations 150, as described in greater detail below with reference to FIG. 2.

The rear surface 103b of the enclosure 102 faces opposite the front surface 103a and, in one embodiment, provides service access to the components within the enclosure 102. For example, the processing stations 150 and associated electrical, mechanical, and chemical systems may be accessed from service access openings (not visible in FIG. 1) in the rear surface 103b. In one aspect of this embodiment, service access to the apparatus 100 are provided exclusively via the front surface 103a and the rear surface 103b. Accordingly, the side surfaces 103c need not have service access panels and need not be accessible for service after the apparatus 100 is installed. One feature of this embodiment is that the effective footprint of the apparatus 100 is less than that of some conventional tools because, for example, the apparatus 100 does not require access aisles along the side surfaces 103c of the enclosure 102.

In another embodiment, the apparatus 100 is positioned in a clean room environment 120 that is adjacent to a gray room environment 121. In one aspect of this embodiment, the gray room environment 121 includes a room separated from the clean room environment 120 by a wall 122 and defines a generally clean environment that need not meet clean room standards. The wall 122 includes an aperture 123, and the rear surface 103b of the enclosure 102 is placed adjacent to the aperture 123 with the front surface 103a and the side surfaces 103c projecting into the clean room environment 120. A seal 124 is disposed around the periphery of the enclosure 102 at the aperture 123 to maintain the separation between the clean room environment 120 and the gray room environment 121. This arrangement can have several advantages. For example, the effective footprint of the apparatus 100 is reduced when compared with the footprint of conventional arrangements because an aisle need not be provided in the clean room environment 120 adjacent to the rear surface 103b. When service is performed on the apparatus 100, most of the internal components of the apparatus 100 are accessible from the gray room environment 121 through the access openings in the rear surface 103b. Accordingly, many service functions may be provided without requiring service personnel to enter the clean room environment 120, which entails the time consuming process of "suiting up" in clean room suits prior to entry.

In other embodiments, the apparatus 100 has other positional arrangements that also reduce the effective footprint of the apparatus 100. For example, in one embodiment, the apparatus 100 is moved rearwardly through the aperture 123 into the gray room environment 121 with at least a portion of (and optionally, the entirety of) the side surfaces 103c received in the gray room environment 121. Accordingly, the amount of clean room floor space required by the apparatus 100 is less than for some other tools having a similar number of processing stations.

In one aspect of the foregoing embodiments, the side surfaces 103c need not be accessible to operate or service the apparatus 100. Accordingly, the side surfaces 103c need not include access panels configured for regular access. Alternatively, the apparatus 100 may be placed end-to-end with another processing tool, and at least one of the side surfaces 103c may have an opening configured to allow the microelectronic workpieces 114 to be automatically transferred from the apparatus 100 to the adjoining processing tool.

FIG. 2 is a cross-sectional side view of the apparatus 100 described above with reference to FIG. 1 in accordance with an embodiment of the invention. In one aspect of this embodiment, at least one of the processing stations 150 includes a vessel 152 configured to provide a processing fluid, such as an electrolytic or electroless processing fluid for metal deposition. In one embodiment, a support 160 is positioned proximate to the vessel 152 and is configured to receive single microelectronic workpieces 114 and carry the microelectronic workpieces 114 in contact with the processing fluid. In another embodiment, the support 160 is configured to simultaneously carry a plurality of microelectronic workpieces 114. In still further embodiments, the processing station 150 has other configurations and carries out other functions, such as rinsing, drying, etching, spraying, measuring, annealing or coating the microelectronic workpieces 114. Other arrangements for processing stations 150 and supports 160 are included in U.S. Pat. Nos. 6,136,163 and 6,139,712, both incorporated herein by reference. In some of the foregoing embodiments, the processing stations 150 do not include vessels, and accordingly, the support 160 carries the microelectronic workpiece 114 relative to other portions of the processing stations 150.

In one embodiment, the support 160 includes a head 161 having a receiving surface 162 (such as an annular ring) positioned to receive the microelectronic workpiece 114. In one aspect of this embodiment, the head 161 is supported by a carrier 164 and rotates relative to the carrier 164 about a head rotation axis 166 (as indicated by arrow A) between a manual transfer position (shown in FIG. 2) and a process position. In one embodiment, the receiving surface 162 faces upwardly to allow a user to manually place the microelectronic workpiece 114 on the head 161, or manually remove the microelectronic workpiece 114 from the head 161 when the carrier 164 is in the manual transfer position. In one aspect of this embodiment, the user manipulates a wand 108 having a vacuum end effector to place and remove the microelectronic workpiece 114. In other embodiments, the user places and removes the microelectronic workpiece 114 directly by hand or the user operates other manual implements. In any of these embodiments, the head 161 can rotate 180 degrees about the head rotation axis 166 from the manual transfer position to the process position, and can be lowered into the vessel 152 for processing the microelectronic workpiece 114.

In a further aspect of this embodiment, the support 160 includes a support holder 180 that supports the carrier 164 from a position located above the processing station 150. In one embodiment, the carrier 164 is movable relative to the support holder 180, as described in greater detail below with reference to FIG. 6. In another embodiment, the carrier 164 is fixedly supported from above. In either embodiment, the carrier 164 can include an elevator 165 that moves the head 161 upwardly and downwardly as indicated by arrow B. Accordingly, the head 161 can move along a guide path upwardly to the manual transfer position, then rotationally and downwardly to the process position.

In another aspect of this embodiment, the shield 134 extends proximate to the support 160 to at least restrict contact between the user and the transfer device 130 while the user manually accesses the head 161. For example, in one embodiment, the shield 134 includes an upright portion 135 that extends upwardly to a position above the transfer device 130. The shield 134 further includes a transverse portion 136 that extends transversely over the transfer device 130 toward the support 160. Accordingly, the shield 134 at least restricts the user's access to the transfer device 130, while allowing the user to access the head 161 when the head 161 is in the manual transfer position. In a further aspect of this embodiment, the shield 134 is transparent to allow observation of the transfer device 130.

In a method in accordance with one embodiment, the user places a container 113 on the support surface 115 adjacent to the upright portion 135 of the shield 134. The user can then remove one of the microelectronic workpieces 114 from the container 113 in preparation for transferring the microelectronic workpiece 114 to the support 160. The support 160 moves upwardly to the manual transfer position. In one aspect of this embodiment, the head 161 of the support 160 moves upwardly until the receiving surface 162 is at or above the elevation of the transverse portion 136 of the shield 134. The user then reaches over the shield 134 to load (or unload) the microelectronic workpiece 114 while the shield 134 protects the user from inadvertent contact with the transfer device 130. In one aspect of this embodiment, if the transfer device 130 attempts to access the support 160 while the support 160 is in the manual transfer position, the head 161 will interfere with the motion of the transfer device 130, providing additional protection for the user accessing the support 160 manually.

In one aspect of this embodiment, the user alternates between dedicating the apparatus 100 to manual processing and dedicating the apparatus 100 to automatic processing. In another embodiment, the apparatus 100 automatically processes some microelectronic workpieces 114 in one or more of the processing stations 150 while the user simultaneously processes other microelectronic workpieces 114 manually in processing stations not concurrently occupied by automatically processed microelectronic workpieces 114. In either embodiment, the user can enter the appropriate commands at the user interface 107 to allow manual operation and/or initiate and direct automatic operation. In either embodiment, the same apparatus 100 can automatically process microelectronic workpieces 114 in a manner described below with reference to FIG. 3.

FIG. 3 is a cross-sectional side view of the apparatus 100 described above with reference to FIGS. 1 and 2 showing the support 160 located in an automatic transfer position to transfer the microelectronic workpiece 114 to and/or from the transfer device 130. In one aspect of this embodiment, the automatic transfer position is located in a plane beneath the plane of the manual transfer position (FIG. 2) and beneath the transverse portion 136 of the shield 134. Accordingly, the transfer device 130 is able to access the receiving surface 162 of the head 161. In one embodiment, the transfer device 130 includes a base 137 supported by the transfer device support 132 for movement transverse to the plane of FIG. 3. In a further aspect of this embodiment, the base 137 supports a lift 138 connected to an arm 139 to move the arm 139 upwardly and downwardly relative to the base 137. Two end effectors 140 (shown as an upper end effector 140a and a lower end effector 140b) are pivotally attached to the arm 139 to rotate relative to the arm 139, as described in greater detail below with reference to FIG. 4. Each end effector 140 can carry a microelectronic workpiece 114, for example, with a vacuum grip or another releasable gripping mechanism, and can move toward and away from the head 161.

During automatic operation in accordance with one embodiment, the elevator 165 of the support 160 moves the head 161 to the automatic transfer position to receive a microelectronic workpiece 114 from the transfer device 130. After the transfer device 130 places the microelectronic workpiece 114 on the receiving surface 162 of the head 161, the elevator 165 elevates the head 161 slightly to provide vertical clearance between the head 161 and the vessel 152. The head 161 then rotates 180 degrees about the head rotation axis 166 (as described above with reference to FIG. 2) and the elevator 165 lowers the head 161 to the process position. The foregoing steps are reversed after processing to remove the microelectronic workpiece 114 from the head 161.

One feature of the foregoing embodiments described above with reference to FIGS. 1–3 is that the support 160 selectively stops at two different positions for receiving the microelectronic workpiece 114: a manual transfer position for manually placing and removing the microelectronic workpieces, and an automatic transfer position for automatically placing and removing the microelectronic workpieces 114. The use of different positions for manually and automatically transferring the microelectronic workpieces 114 can provide several advantages. For example, when the support 160 is in the manual transfer position, the user is shielded from contact with the automatic transfer device 130, and when the support 160 is in the automatic transfer position, the transfer device 130 is able to access the support 160. The different positions can also provide a visual cue to the user to indicate to the user when it is appropriate to manually access the support 160. For example, in one embodiment, the user can see that when the head 161 is positioned above the transverse portion 136 of the shield 134, the receiving surface 162 is accessible for manual loading and/or unloading. Conversely, when the head 161 is positioned below the transverse portion 136 of the shield 134, the user can see that the head is positioned for automatic transfer and is not available for manually receiving or discharging the microelectronic workpiece 114.

In one embodiment, the support 160 moves upwardly and downwardly between the manual transfer position and the automatic transfer position, and rotates between the transfer positions and the process position. In other embodiments, the support 160 moves along different axes and/or in different manners between any of these three positions. In still a further embodiment, the manual transfer position and the automatic transfer position are identical. In one aspect of this embodiment, the user is protected from inadvertent contact with the transfer device 130 by other arrangements, for example, a moving shield 134.

FIG. 4 is an isometric view of a transfer device 130 in accordance with an embodiment of the invention. In one aspect of this embodiment, the transfer device 130 includes a robot 131 supported by the transfer device support 132 (FIG. 3) to move linearly as indicated by arrow C. Accordingly, the robot 131 can be automatically moved into alignment with the input/output station 110 (FIG. 1) and any of the processing stations 150 (FIG. 1). The base 137 of the transfer device 130 supports the lift 138 for upward and downward motion, as indicated by arrow D. The lift 138 supports the arm 139 for rotational motion, as indicated by arrow E. In one embodiment, the arm 139 has a single eccentric projection 146 that extends away from the axis along which the lift 138 moves, and that supports the end effectors 140. In another embodiment, the arm 139 has multiple projections. The single eccentric projection 146 can be less likely than multiple projection arrangements to interfere with surrounding components when the arm 139 rotates. In either embodiment, the end effectors 140 can rotate independently relative to the arm 139 about a common axis, as indicated by arrow F.

In one aspect of this embodiment, the robot 131 is coupled to a control unit 141 with a flexible cable 142 (such as a ribbon cable). Accordingly, the robot moves linearly as indicated by arrow C without restriction from the cable 142. In a further aspect of this embodiment a significant portion of the control and power circuitry required to operate the robot 131 is positioned in the control unit 141 rather than on the robot 131 itself. An advantage of this arrangement is that the robot 131 can be made smaller and can accordingly require less space in which to move.

FIG. 5 is a partially schematic, cross-sectional side view of the robot 131 in accordance with an embodiment of the invention. In one aspect of this embodiment, the upper end effector 140a is supported on an inner shaft 144a and the lower end effector 140b is supported on an outer shaft 144b disposed outwardly from the inner shaft 144a. The outer shaft 144b is driven by an outer shaft belt 145b (extending out of the plane of FIG. 5) which is in turn driven by an outer shaft pulley (not visible in FIG. 5). The inner shaft 144a is coupled to an inner shaft belt 145a which is in turn powered by an inner shaft pulley 143a. Because the upper end effector 140a is vertically spaced apart from the lower end effector 140b, each end effector 140 moves without interfering with the movement of the other. By providing independent power transmission to each end effector 140, each end effector 140 moves independently of the other. For example, one of the end effectors 140 can position a microelectronic workpiece 114 on the support 160 (FIG. 3) while the other end effector 140 retains a microelectronic workpiece 114 for delivery to a different support 160 or to the input/output device 110 (FIG. 1).

In other embodiments, the transfer device 130 has other configurations. For example, in other embodiments, the transfer device 130 carries a single microelectronic workpiece 114 or more than two microelectronic workpieces 114. When the transfer device 130 carries more than one microelectronic workpiece 114, the motion of each microelectronic workpiece 114 can be at least partially independent, as described above with reference to FIGS. 4 and 5. Alternatively, the transfer device 130 can be configured to automatically move a plurality of microelectronic substrates 114 together in a batch arrangement, for example, with or without a separate carrier or container configured for use within the enclosure 102. Further details of aspects of transfer devices in accordance with other embodiments of the invention are included in U.S. patent application Ser. No. 09/875,300, filed Jun. 5, 2001, U.S. patent application Ser. No. 10/080,910 and published PCT Application No. PCT/US99/14414, all incorporated herein by reference.

FIG. 6 is a cross-sectional side view of the apparatus 100 with the support 160 arranged to be movable relative to the support holder 180 in accordance with an embodiment of the invention. In one aspect of the embodiment shown in FIG. 6, the carrier 164 of the support 160 is suspended from the support holder 180, with the support holder 180 positioned above the head 161 and the vessel 152 of the processing station 150. The support holder 180 includes a support guide path 181 along which the support 160 moves between an operational position (shown in solid lines in FIG. 6) and an access position (shown in phantom lines in FIG. 6). In the operational position, the head 161 is positioned to have microelectronic workpieces 114 automatically or manually transferred to it or from it, as described above. In the access position, the head 161 is moved transversely away from the processing station 150 to allow access to the vessel 152. Accordingly, the user may access the vessel 152 from the front surface 103a of the enclosure 102 (for example, for maintenance) while the support 160 is in the access position.

In one aspect of this embodiment, the support guide path 181 is generally straight and transverse to the vertical motion of the head 161 as it moves relative to the vessel 152. In other embodiments, the support guide path 181 has other configurations. For example, in one alternate embodiment, the support guide path 181 is curved.

In a further aspect of the embodiment shown in FIG. 6, the entire support 160 is disconnected from the apparatus 100 and removed through the rear surface 103b of the enclosure 102 by moving and/or removing an access panel 184 at the rear surface 103b. Accordingly, the support 160 may be serviced remotely from the apparatus 100, and the user may have additional access to the chamber 150 and the vessel 152 through the rear surface 103b of the enclosure 102. In one aspect of this embodiment, the support holder 180 includes an arrangement of rails for linear movement of the support 160, as described in greater detail below with reference to FIGS. 7 and 8. In other embodiments, the support holder 180 has other configurations for moving the support 160 relative to the chamber 150 and/or relative to the apparatus 100. For example, in other embodiments, the support 160 pivots about one or more axes to allow access to the chamber 150.

FIGS. 7 and 8 are partially schematic illustrations of a support 160 configured for installation and removal in accordance with an embodiment of the invention. Referring first to FIG. 7, an embodiment of the support holder 180 includes a pair of guide rails 182 (one of which is visible in FIG. 7), each having a linear channel 183 aligned along the support guide path 181. The carrier 164 of the support 160 includes guide members 174 slidably received in the channels 183. Accordingly, in one embodiment, the carrier 164 is suspended or at least partially suspended from the guide rails 182.

In a further aspect of this embodiment, the carrier 164 includes features that allow it to be aligned and positioned within the apparatus 100. For example, in one embodiment, the carrier 164 includes a plurality of locator balls 170, shown as an upper locator ball 170a and a pair of lower locator balls 170b (one of which is visible in FIG. 7). An embodiment of the apparatus 100 includes corresponding features positioned to receive and align the locator balls 170. For example, in one embodiment, the apparatus 100 includes an upper support beam 168a having an upper support bracket 169 configured to receive the upper locator ball 170a. The apparatus 100 further includes a lower support beam 168b having two lower support brackets 175, including a left lower support bracket 175a and a right lower support bracket 175b (not visible in FIG. 7), positioned to receive the lower locator balls 170b.

In one embodiment, the upper support bracket 169 has a positioning surface 171 arranged to contact the upper locator ball 170a. The upper support bracket 169 is adjustable forward and aft, as indicated by arrow G. Upon installation, the forward and aft position of the upper support bracket 169 may be adjusted until the carrier 164 is vertically aligned. Once the carrier 164 is properly aligned, a locking mechanism 172 having a latch 173 may be actuated to secure the upper locator ball 170a against the positioning surface 171. To move or remove the carrier 164, the locking mechanism 172 is released, allowing the carrier 164 to pivot rearwardly about the lower locator ball 170b, as indicated by arrow H and as shown in dashed lines in FIG. 7. After the carrier 164 has pivoted rearwardly as shown in FIG. 7, the lower locator balls 170b is removed from the lower support brackets 175 and the carrier 164 is moved further aft to the access position, and/or removed from the apparatus 100, as described above with reference to FIG. 6.

FIG. 8 is a partially schematic, partially broken rear view of a portion of the support 160 supported in the apparatus 100 at least in part by the guide members 174. In one aspect of this embodiment, the guide members 174 are slidably received in the guide rails 182. In another embodiment, the guide members 174 include wheels that roll along the guide rail 182, and in other embodiments, the apparatus 100 includes other arrangements that allow for relative movement between the support 160 and the support holder 180. In any of these embodiments, the support carrier 164 can include an electrical terminal 163 configured to releasably receive an electrical cable (not shown) and a pneumatic terminal 167 configured to releasably receive a pneumatic conduit (not shown). The electrical cable and the pneumatic conduit may be detached from the carrier 164 prior to removing the support 160 from the apparatus 100.

In one aspect of an embodiment of apparatus 100 shown in FIG. 8, the lower support brackets 175 (shown as the left lower support bracket 175a and the right lower support bracket 175b) are configured to accommodate transverse alignment of the carrier 164. For example, in one embodiment the left support bracket 175a includes a generally flat receiving surface 176 along which a corresponding one of the lower locator balls 170b slides. The right support bracket 175b includes a receiving cradle 177 configured to receive the other lower locator ball 170b and at least restrict movement of the other lower locator ball 170b to provide additional support for the carrier 164. Accordingly, the receiving cradle 177 may be adjusted laterally as indicated by arrow I using adjustment screws 178.

One feature of an embodiment of the apparatus 100 described above with reference to FIGS. 6–8 is that the support 160 is supported by a support holder 180 that allows for movement of the support 160 while the weight of the support 160 is still borne by the apparatus 100. Accordingly, it is easier to reposition the support 160 while accessing the processing station 150 below. Another advantage of this feature is that it is easier to remove the support entirely from the apparatus 100 through the rear surface 103b of the apparatus 100.

Another feature of an embodiment of the support 160 is that it is carried from a position located above the processing station 150. One advantage of this feature is that the support 160 need not occupy space below the head 161 and adjacent to the processing station 150. Instead, this space can be left free (for example, to access the processing station 150) or can be occupied by additional support equipment for the processing station 150. Another advantage of this arrangement is that the electrical cable between the support 160 and the electrical units 105 that provide power and control signals to the support 160 is shorter than existing cables because the support 160 is positioned closer to the electrical units 105. Still another advantage of this arrangement is that the electrical cable may be positioned entirely above the processing station 150 when it is coupled to the support carrier 164. Accordingly, the likelihood for contact between the electrical cable and the chemicals contained in the processing station 150 is reduced and/or eliminated.

B. Processing Stations for Processing Microelectronic Workpieces

FIGS. 9–18 illustrate several details of processing stations that can be included in tools generally similar to those described with reference to FIGS. 1–8. A wide variety of microelectronic workpiece processing techniques may be performed simultaneously and/or sequentially using various combinations of processing stations such as those described below. In further embodiments, the processing stations have characteristics in addition to or in lieu of those described below for providing different and/or additional functions. In one representative process, microelectronic workpieces are evaluated at a metrology station (FIG. 9). Material is applied to the workpieces and/or enhanced and/or repaired at an electrochemical deposition station (FIGS. 11–14) or an electroless deposition deposition station (FIG. 15) to produce layers such as those shown in FIGS. 10A–10E. The workpieces are bevel etched and cleaned at a capsule station (FIGS. 16A–B) and/or rinsed at a spray station (FIG. 17), and annealed in a thermal processing station (FIG. 18). In other embodiments, the apparatus performs other processes and/or other process sequences.

Metrology Station

FIG. 9 is a schematic illustration of a metrology station 900 that is included as one or more of the processing stations 150 described above with reference to FIGS. 1–8, in accordance with an embodiment of the invention. In one aspect of this embodiment, the metrology station 900 includes a base 910 having one or more supports 920 configured to removably support the microelectronic workpiece 114. A detector 930 is operatively coupled to the microelectronic workpiece 114 while the microelectronic workpiece 114 is carried by the supports 920. The detector 930 is configured to detect characteristics of portions of the microelectronic workpiece 114. For example, in one embodiment, the detector 930 is configured to detect a uniformity of a conductive layer (such as a seed layer or a blanket layer) or other conductive feature on the microelectronic workpiece 114. In one aspect of this embodiment, the detector 930 uses sheet resistance or capacitance to determine the thickness of the conductive layer. In another embodiment, the detector 930 uses optical or thermal techniques to determine selected characteristics of the microelectronic workpiece 114. For example, in one embodiment, the detector 930 includes a laser based, non-constant metrology system in which an emitted laser beam induces an acoustic response in the layer of the microelectronic workpiece 114. The acoustic response is then correlated with the thickness of the layer. This is known as an impulsive stimulated thermal scattering (ISTS) system. One such system is manufactured by Phillips Analytical, Inc. of Natick, Mass. under the model name "Impulse" or "Emerald." Another suitable metrology unit is manufactured by Rudolph, Inc. of Flanders, N.J., under the model name "Metapulse."

In any of the foregoing embodiments, the detector 930 can be operatively coupled to an analyzer 940 to analyze and/or otherwise process the data received by the detector 930. In one aspect of this embodiment, the analyzer 940 is coupled to a controller 950 which is in turn coupled with a link 960 to one or more of the other processing stations 150 of the tool 100 (FIG. 1). Accordingly, data obtained at the metrology station 900 may be used to influence processes conducted at other processing stations, as described in greater detail below.

In one embodiment, the metrology station 900 is used in a "feed-forward" mode. Accordingly, the results obtained at the metrology station 900 are used to influence and/or control subsequent processes performed on the microelectronic workpiece 114 in a manner that accounts for the unique characteristics of that particular microelectronic workpiece 114. In another embodiment, the metrology station 900 is used in a "feed-back" mode. In this mode, the microelectronic workpiece 114 is analyzed after a selected process is performed on the microelectronic workpiece 114, and the results are used to influence the manner in which that same process is performed on other microelectronic workpieces. Examples of feed-forward and feed-back processes are described in greater detail below.

In one feed-forward mode of operation, the recipe for one or more downstream processes is modified based on the results obtained at the metrology station 900. Alternatively, or additionally, the sequence with which subsequent processes are carried out is modified based on the metrology results. For example, in one embodiment, if the thickness or uniformity of a seed layer of the microelectronic workpiece 114 is outside acceptable limits, the microelectronic workpiece 114 is delivered to a seed layer enhancement station (described in greater detail below with reference to FIGS. 10A–15) before being delivered to an electroplating station (also described in greater detail below with reference to FIGS. 10A–15). Alternatively, if the seed layer is so far out of tolerance that it cannot be repaired or enhanced in the seed layer enhancement station, the microelectronic workpiece 114 may be delivered to a material removal station (described in greater detail below with reference to FIGS. 16A–17) in which the microelectronic workpiece 114 can be etched. The microelectronic workpiece 114 is then returned to a seed layer application station, such as a physical vapor deposition (PVD) apparatus external to the apparatus 100.

In other embodiments, the results obtained at the metrology station 900 are used to influence not only where the microelectronic workpiece 114 goes after leaving the metrology station 900, but also aspects of the process performed on the microelectronic workpiece 114 at the next processing station. For example, in one embodiment, the process parameters used during deposition and/or alteration of blanket metal layers, blanket dielectric layers, patterned metal layers, and patterned dielectric layers are established, altered, adjusted, or otherwise controlled based on the results obtained at the metrology station 900. In one embodiment, an intentional variation in one parameter (e.g., film thickness) is introduced in order to compensate for another non-uniformity (e.g., line width) to produce uniform electrical results.

In another embodiment, the user assesses the results obtained at the metrology station 900 and decides to stop subsequent processes until issues associated with the prior processes are resolved. For example, in one aspect of this embodiment, a blanket layer electroplating process is stopped when seed layer thicknesses are found to be below acceptable tolerances. In another aspect of this embodiment, the user continues the subsequent processing (e.g., the electroplating process) and adjusts the subsequent process steps or process parameters based upon the output from the metrology station 900. For example, in one embodiment, the user goes forward with the electroplating process, but automatically adjusts the process recipe to achieve acceptable plating uniformity and thicknesses, again based on the results obtained at the metrology station 900.

In one aspect of a feed-back mode of operation, the metrology station 900 is used to alter processes normally conducted before the microelectronic workpiece 114 arrives at the processing station 900. For example, in one embodiment, the microelectronic workpiece 114 is placed in the metrology station 900 after an electrochemical deposition (ECD) process to assess the uniformity or other characteristic of the material applied during the ECD process. If the uniformity or other characteristic of the applied material is found to be out of tolerance, the process recipe conducted at the ECD station is adjusted prior to processing other microelectronic workpieces 114 having similar initial characteristics. For example, if it is determined at the processing station 900 that microelectronic workpieces 114 having an initial seed layer with fixed, known characteristics return from an ECD station with unacceptable results when process 1 is followed, but acceptable results if process 2 is followed, then the controller 950 automatically directs the ECD station to use process 2 when other microelectronic workpieces 114 having similar initial seed layers are to be processed.

In other embodiments, the metrology station 900 has other arrangements. Examples of other embodiments for the metrology station 900 are included in International Application PCT/US01/21579 filed Jul. 9, 2001 and incorporated herein in its entirety by reference. In any of these embodiments, the controller 950 may be used to control processes conducted at any of the stations within the tool 100 (FIG. 1), or alternatively, the controller 950 may be operatively coupled to devices external to the tool 100 to control processes conducted therein. For example, material may be removed from the microelectronic workpiece 114 in a chemical-mechanical planarization (CMP) apparatus that is positioned external to the tool 100.

Material Application Stations

FIGS. 10A–15 illustrate stations suitable for applying materials to the microelectronic workpiece 114. These stations include electrochemical deposition (ECD) stations, such as electrolytic deposition stations which apply materials in an electrolytic process, and electroless stations, which can apply materials in a non-electrical, chemical process. In one embodiment, electrolytic ECD stations (described below with reference to FIGS. 11–14) are used to apply conductive materials, such as copper, aluminum, platinum, solder or gold. The conductive materials are applied as a new blanket layer or to enhance or repair an existing seed layer. Accordingly, any of these stations can function as a seed layer repair/enhancement station. Examples of processes and solutions suitable for carrying out such functions are included in International Application No. PCT/US99/06306, filed Mar. 22, 1999 and incorporated herein in its entirety by reference. Alternatively, (for example, by reversing the polarity applied to electrodes during metal deposition), these stations can be used to apply insulative materials, in an electrophoretic process. The electroless stations (described below with reference to FIG. 15) can also be used to apply conductive materials, such as blanket layers or seed layer repair/enhancement materials, without the application of electrical currents.

FIGS. 10A–10E illustrate sample processes that can be conducted with material application stations in accordance with embodiments of the invention. In one embodiment, shown in FIG. 10A, the microelectronic substrate 114 includes a feature such as a trench 1012 that is to be filled with a metal or other conductive material. A thin barrier layer 1010 is deposited on the microelectronic substrate 114 and in the trench 1012. Alternatively, the barrier layer 1010 is deposited over a dielectric material, such as silicon dioxide. In either embodiment, the barrier layer 1010 includes titanium nitride, tantalum nitride, or another material that can act to prevent a conductive material subsequently disposed in the trench 1012 from migrating into other features of the microelectronic substrate 114. The barrier layer 1012 is deposited using known techniques, such as chemical vapor deposition (CVD) or physical vapor deposition (PVD).

Referring now to FIG. 10B, an ultra-thin metallic seed layer 1011 is disposed on the barrier layer 1010. In one embodiment, the ultra-thin seed layer 1011 includes copper, and in other embodiments, the ultra-thin seed layer 1011 includes other materials. In either embodiment, the ultra-thin seed layer 1011 is deposited using CVD, PVD or other techniques.

In one aspect of this embodiment, the ultra-thin seed layer 1011 is deposited to a thickness of only about 50 angstroms to about 500 angstroms. Accordingly, voids 1013 or other nonuniformities may remain in the seed layer 1011 after it is formed. As shown in FIG. 10C, the seed layer 1011 may be enhanced by electrochemically applying additional conductive enhancement material 1014 on the ultra-thin seed layer 1011 to fill in the voids 1013 (FIG. 10B). Accordingly, the barrier layer 1010 can be completely or nearly completely covered with conductive material.

Figure 10E:
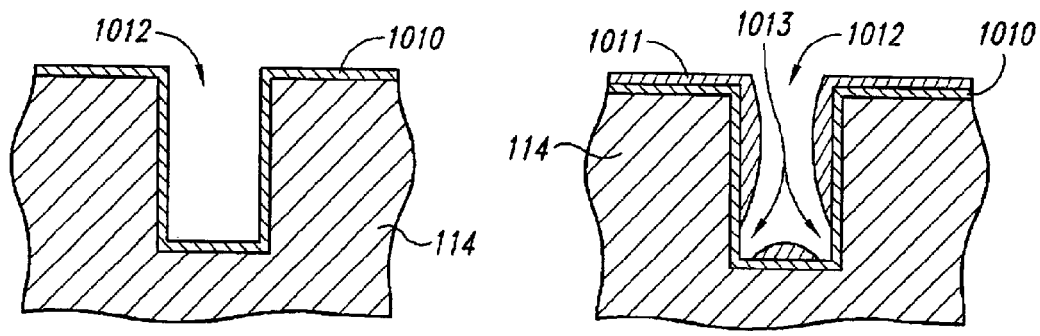
Figure 10E:
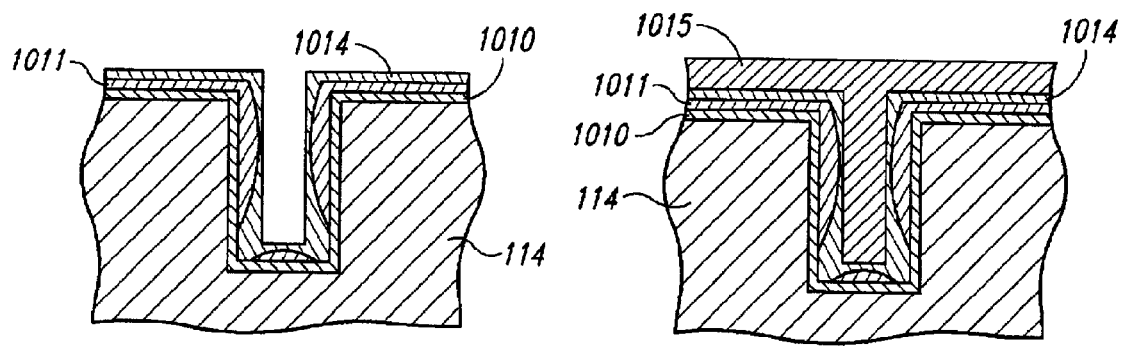
Figure 10E:
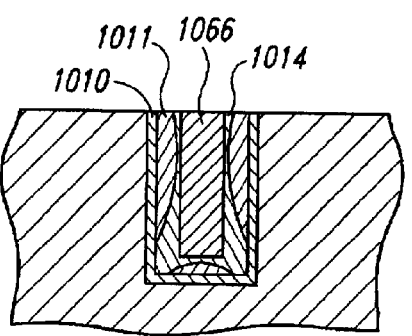

In one embodiment shown in FIG. 10D, a blanket layer 1015 is deposited electrochemically onto the enhancement material 1014 and the ultra-thin seed layer 1011 to fill in the trench 1012. After the trench 1012 has been filled, the portions of the barrier layer 1010, the ultra-thin seed layer 1011, the enhancement material 1014, and the blanket layer 1015 located above the trench 1012 are removed, leaving a line or via 1066, as shown in FIG. 10E. The foregoing process steps may be repeated to build layer upon layer of conductive structures in the microelectronic substrate 114.

Overall Station Arrangement

Figure 11:
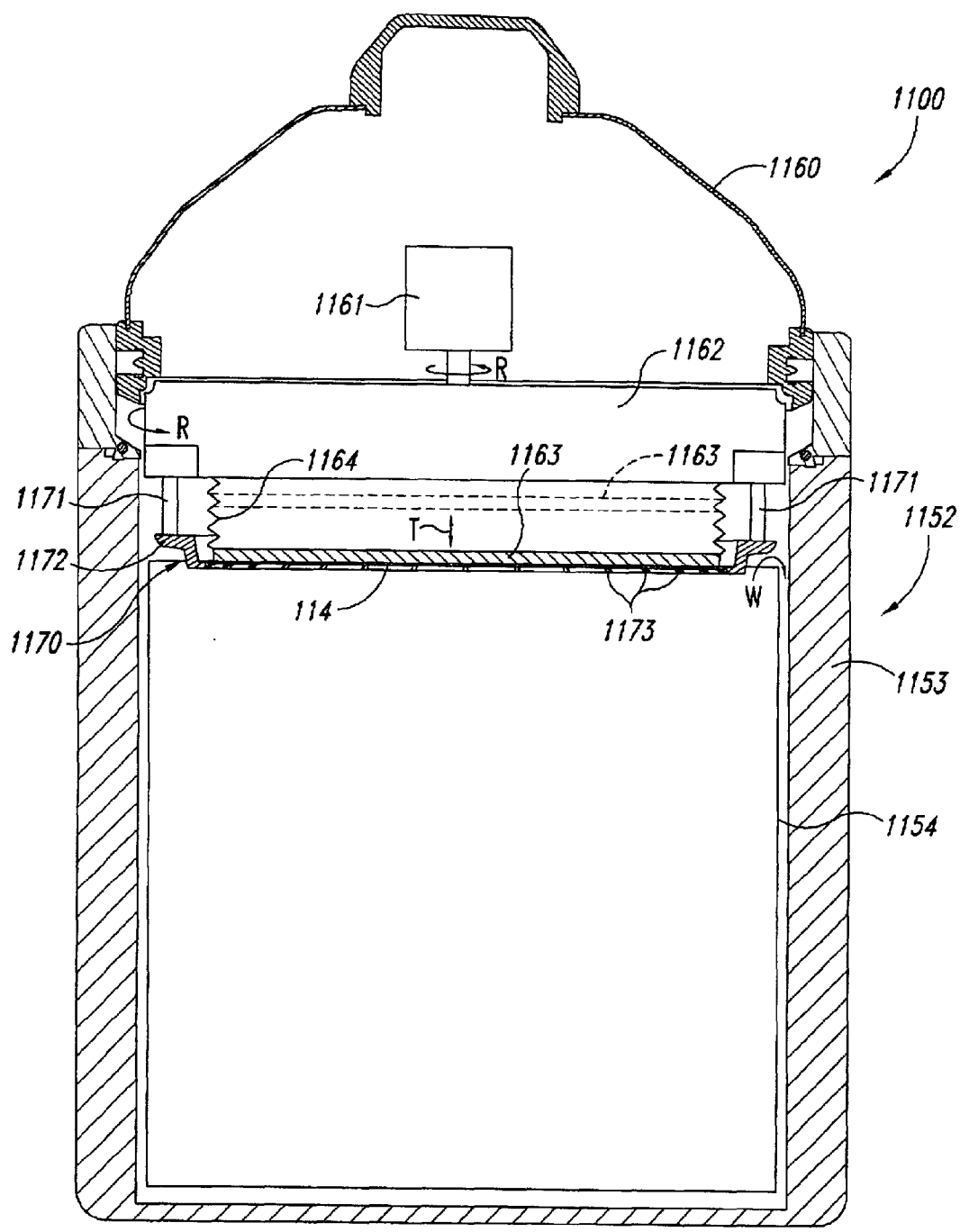
FIG. 11 is a partially schematic illustration of an electrochemical processing station in accordance with an embodiment of the invention.

FIG. 11 illustrates an embodiment of an electrochemical-processing station 1100 having a support 1160 and a vessel assembly 1152 configured for disposing enhancement material and/or blanket layers as described above with reference to FIGS. 10A–10E. In one aspect of this embodiment, the support 1160 includes a spin motor 1161, a rotor 1162 coupled to the spin motor 1161, and a contact assembly 1170 carried by the rotor 1162. The contact assembly 1170 is configured to make electrical contact with either the front side or the back side of the microelectronic workpiece 114. The rotor 1162 has a backing plate 1163 and a seal 1164. The backing plate 1163 moves transverse to the microelectronic workpiece 114 (arrow T) between a first position in which the backing plate 1163 contacts a backside of the workpiece 114 (shown in solid lines in FIG. 11) and a second position (shown in broken lines in FIG. 11) in which it is spaced apart from the backside of the workpiece 114. In one embodiment, the contact assembly 1170 has a support ring 1172, a plurality of contacts 1173 carried by the support ring 1172, and a plurality of shafts 1171 extending between the support ring 1172 and the rotor 1162. The contacts 1173 are ring-type spring contacts or other types of contacts that are configured to engage a portion of the seed-layer on the workpiece 114. Commercially available support 1160 and contact assemblies 1170 can be used in the station 1100. Particular suitable support 1160 and contact assemblies 1170 are disclosed in U.S. Pat. Nos. 6,228,232 and 6,080,691; and U.S. application Ser. Nos. 09/385,784; 09/386,803; 09/386,610; 09/386,197; 09/501,002; 09/733,608; and 09/804,696, all of which are herein incorporated by reference.

In one embodiment, the vessel assembly 1152 includes an outer vessel 1153 (shown schematically in FIG. 11) and an inner vessel 1154 (also shown schematically in FIG. 11) positioned within the outer vessel 1153. The inner vessel 1154 carries at least one electrode (not shown in FIG. 11) and directs a flow of electroprocessing solution to the workpiece 114. The electroprocessing solution, for example, flows over a weir (arrow W) and into the outer vessel 1153, which captures the electroprocessing solution and sends it back to a tank. Several embodiments of inner vessels 1154 are shown and described in detail with reference to FIGS. 12–14.

In operation, the support 1160 holds the workpiece 114 at a workpiece-processing site of the inner vessel 1154 so that at least a plating surface of the workpiece 114 engages the electroprocessing solution. An electrical field is established in the solution by applying an electrical potential between the plating surface of the workpiece 114 (via the contact assembly 1170) and one or more electrodes in the inner vessel 1154. In one embodiment, for example, the contact assembly 1170 is biased with a negative potential relative to the electrode(s) in the inner vessel 1154 to plate materials onto the workpiece. Alternatively, the contact assembly 1170 can be biased with a positive potential relative to the electrode(s) in the inner vessel 1154 to (a) de-plate or electropolish plated material from the workpiece 114 or (b) deposit other materials (e.g., electrophoretic resist). In general, therefore, materials are deposited on or removed from the workpiece 114 with the workpiece 114 acting as a cathode or an anode depending upon the particular type of material used in the electrochemical process.

Single Electrode Station

Figure 12:
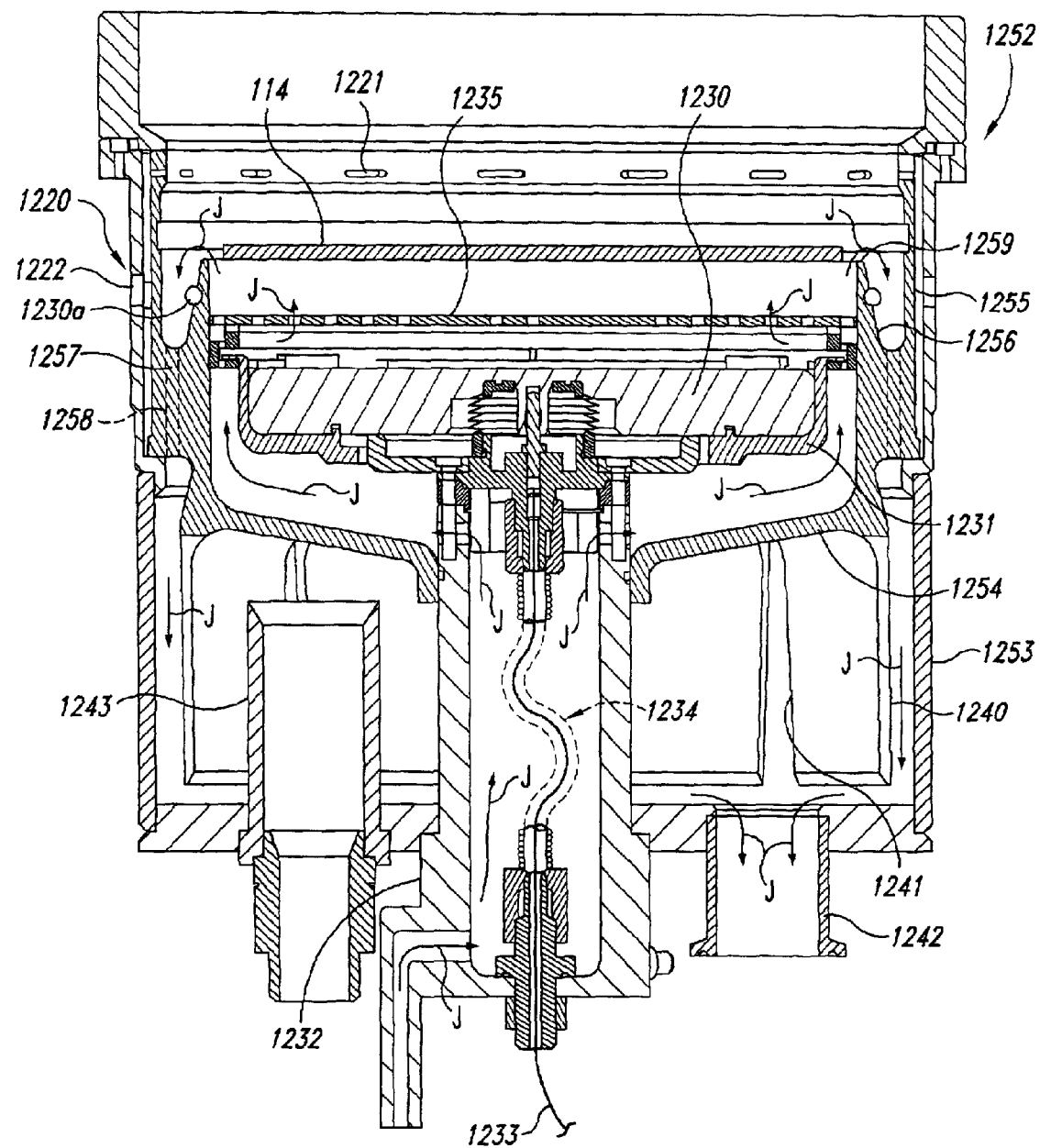
FIG. 12 is a partially schematic illustration of an electrochemical processing station in accordance with another embodiment of the invention.

FIG. 12 is a cross-sectional side view of a vessel assembly 1252 having an inner vessel 1254 disposed within an outer vessel 1253 in accordance with an embodiment of the invention. In one aspect of this embodiment, the inner vessel 1254 has a single electrode 1230 for electrochemically processing the microelectronic workpiece 114 (shown without the support 1160 in FIG. 12). In other embodiments, the vessel assembly 1252 includes multiple electrodes, as described below in greater detail with reference to FIGS. 13–14.

In one aspect of the embodiment shown in FIG. 12, the outer vessel 1253 carries an exhaust ring 1220 which in turn carries the inner vessel 1254 disposed annularly inwardly from the exhaust ring 1220. The inner vessel 1254 includes an inner sidewall 1256 connected to an outer sidewall 1255 with a web 1257. The outer sidewall 1255 includes exhaust ports 1221 which allow gases generated within the inner vessel 1254 to pass radially outwardly. One or more exhaust exits 1222 in the exhaust ring 1220 collect the gas and remove it from the vessel assembly 1252.

In one embodiment, the inner vessel 1254 is coupled to a fluid delivery conduit 1232 through which an electrolytic processing fluid enters, as indicated by arrows J. The electrolytic fluid passes upwardly through the fluid delivery conduit into the inner vessel 1254 and over a weir 1259. Accordingly, the weir 1259 establishes the level of the electrolytic fluid in the vessel assembly 1252 for contacting the microelectronic workpiece 114. The electrolytic fluid passes over the weir 1259 and through openings 1258 in the web 1257 into a region between the inner vessel 1254 and the outer vessel 1253. Skirts 1240 separated by slots 1241 guide the fluid downwardly toward a process outlet 1242, while reducing the tendency for the fluid to splash, which can create undesirable bubbles in the fluid. The fluid is replaced or recycled after passing through the process outlet 1242. An overflow outlet 1243 provides protection against an overflow of the electrolytic fluid.

In one embodiment, the electrode 1230 is positioned within the inner vessel 1254 and is supported on the fluid delivery conduit, for example, with one or more bayonet-type fittings. In one aspect of this embodiment, the electrode 1230 is attached to an electrode shield 1231 which protects the lower surface of the electrode 1230 and which attaches to the fluid delivery conduit 1232 with a first bayonet-type fitting. The electrode shield 1231 in turn supports a diffuser 1235 with a second bayonet-type fitting. The diffuser 1235 conditions the flow of the electrolytic fluid as it approaches the microelectronic workpiece 114. In a further aspect of this embodiment, electrical current is supplied to the electrode 1230 by a cable 1233 housed in a sleeve 1234 that passes through the fluid delivery conduit 1232. The electrode 1230 operates as either an anode (e.g., for plating the microelectronic workpiece 114) or a cathode (e.g., for deplating the microelectronic workpiece 114). In one embodiment, the vessel assembly 1252 further includes an auxiliary electrode 1230a which is configured to "thieve" conductive material that might otherwise plate onto the contact assembly 1170 (FIG. 11). Further details of the foregoing and other embodiments of the vessel assembly are included in U.S. Pat. Nos. 6,228,232, 6,270,647, and 6,080,291, all incorporated herein in their entireties by reference.

Multiple Electrode Stations

Figure 13:
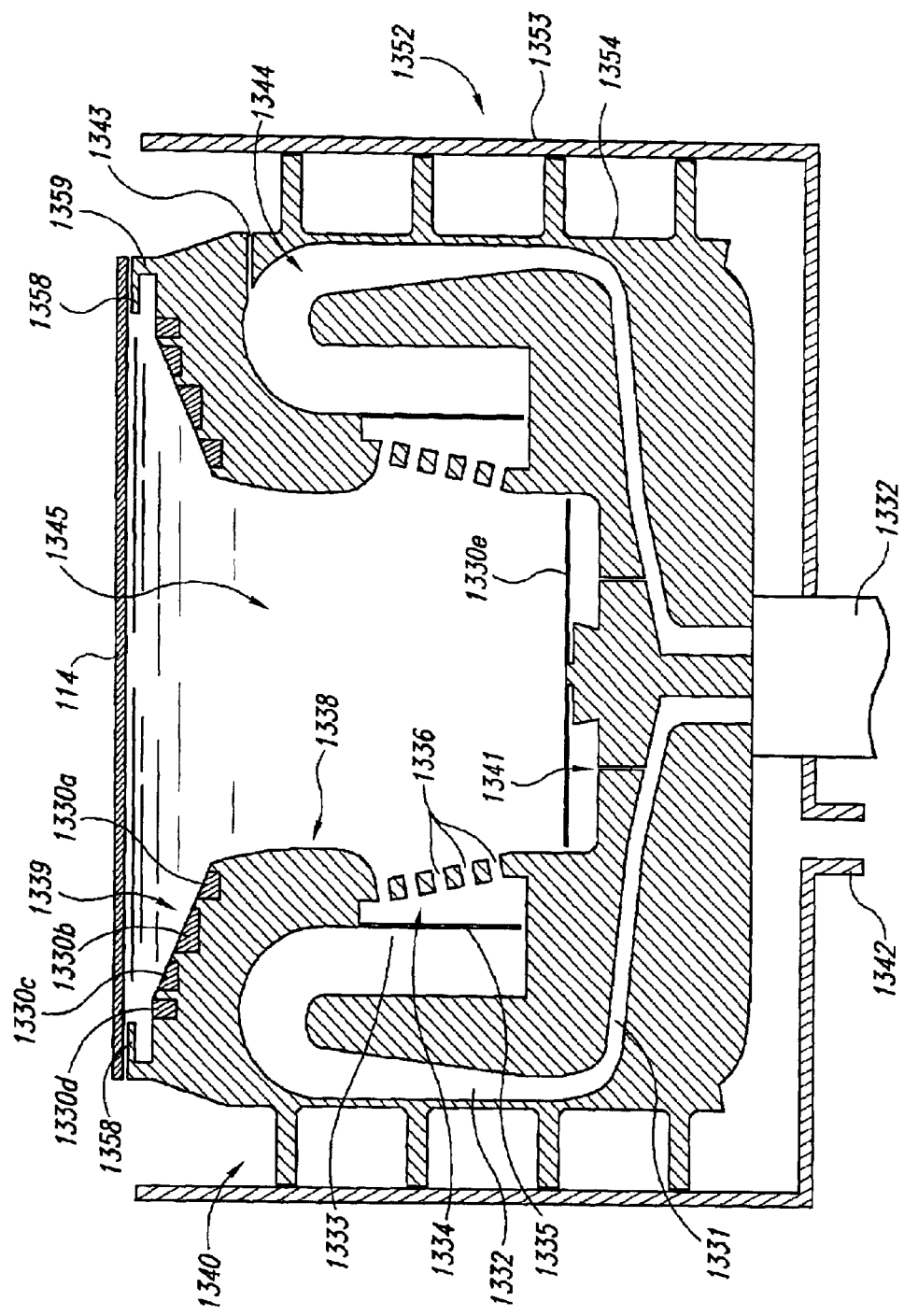
FIG. 13 is a partially schematic illustration of an electrochemical processing station having multiple electrodes in accordance with another embodiment of the invention.
Figure 14:
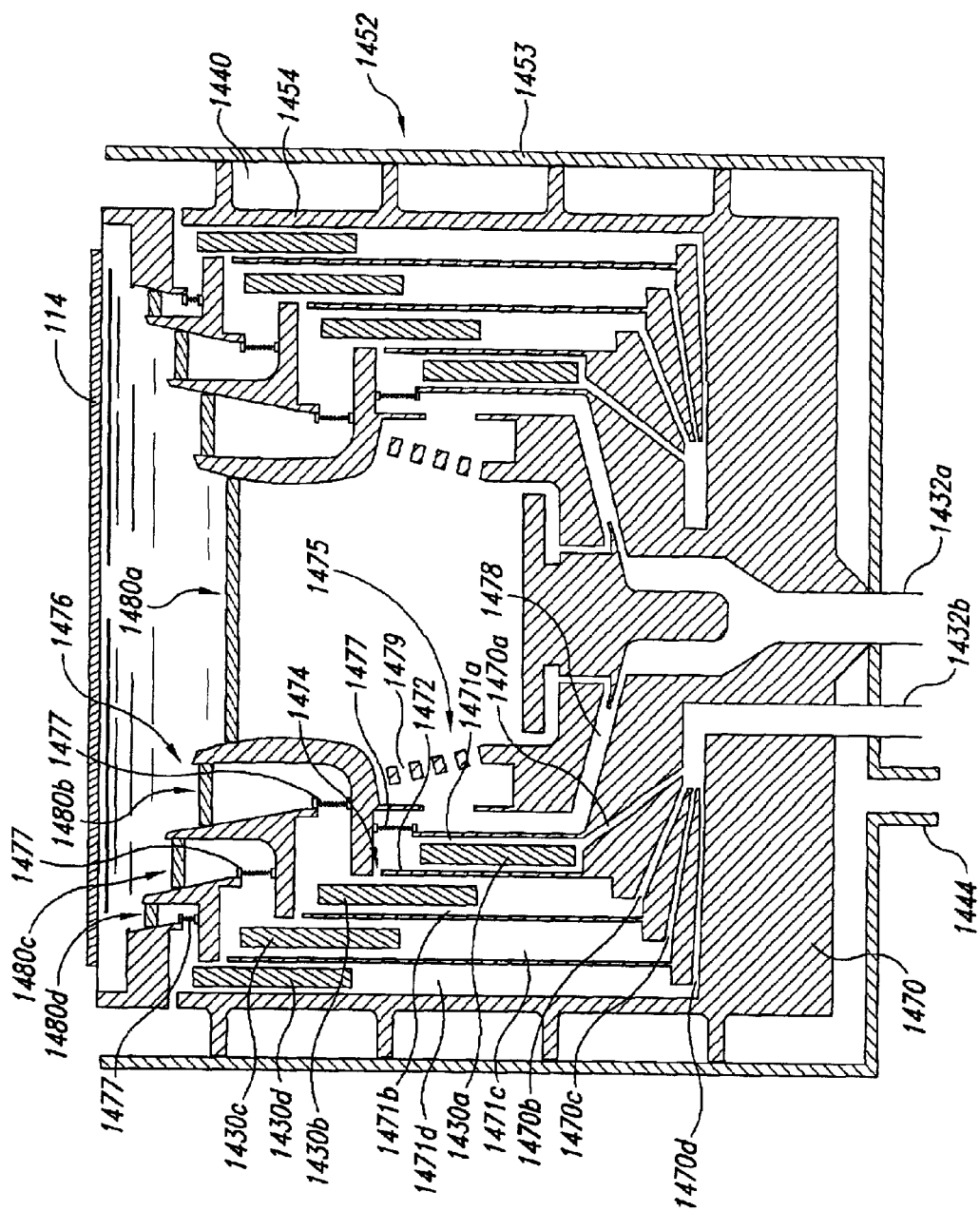
FIG. 14 is a partially schematic illustration of an electrochemical processing station having multiple electrodes and flow paths in accordance with another embodiment of the invention.

FIGS. 13 and 14 schematically illustrate multi-electrode processing stations for electrochemically, electrolytically, and/or electrophoretically depositing and/or removing materials onto microelectronic workpieces in accordance with further embodiments of the invention. One feature of an embodiment of the multi-electrode stations is that the electrical current applied to each electrode is individually controlled to more accurately control the deposition or removal process occurring at the microelectronic workpiece 114. For example, in one embodiment, the current applied to these electrodes is adjusted to account for initial non-uniformities in the microelectronic workpiece 114, or is tailored to deliberately form a non-uniform deposited layer.

Referring first to FIG. 13, a vessel assembly 1352 in accordance with one embodiment includes an inner vessel 1354 disposed annularly within an outer vessel 1353. The inner vessel 1354 is supplied with an electrolytic processing fluid through a fluid inlet 1332. The fluid flows through the inner vessel 1354 in a manner described in greater detail below, and exits the inner vessel 1354 over a weir 1359. The fluid then proceeds through a helical drain channel 1340 positioned between the inner vessel 1354 and the outer vessel 1353 to an outlet 1342, from which the fluid is disposed of or recycled.

In one embodiment, fluid entering the fluid inlet 1332 proceeds radially outwardly through a disk-shaped acceleration channel 1331, then upwardly through a generally U-shaped fluid flow region 1332 positioned annularly within the inner vessel 1354. The U-shaped fluid flow region 1332 forms an antechamber 1344 through which the fluid flows before entering a main fluid flow chamber 1345 at the center of the inner vessel 1354. In one aspect of this embodiment, a gas channel 1343 at the top of the U-shaped fluid flow region 1332 collects gas bubbles in the entering fluid and direct the gas bubbles radially outwardly to the region between the inner vessel 1354 and the outer vessel 1353. Accordingly, the likelihood for introducing gas bubbles at the process surface of the microelectronic workpiece 114 (where they may adversely affect the electrochemical deposition process) can be reduced. The fluid proceeds downwardly through the U-shaped fluid flow region 1332 to a high pressure region 1333, then through a diffuser 1335 to a nozzle assembly 1334. In another aspect at this embodiment, the nozzle assembly 1334 includes a plurality of nozzles 1336 positioned to direct the fluid in a generally uniform manner into the main fluid flow chamber 1345.

In one embodiment, the main fluid flow chamber 1345 is defined in part by a contoured sidewall 1338 that extends upwardly away from the nozzle assembly 1334. The contoured sidewall 1338 is shaped to smoothly transition the flow exiting the nozzle assembly 1334 from being directed generally radially inwardly to being directed generally axially upwardly. In one aspect of this embodiment, the contoured sidewall 1338 transitions either abruptly or smoothly to a slanted sidewall 1339 that directs at least a portion of the fluid flow radially outwardly. The resulting velocity distribution produces a free surface that is initially dome-shaped before the microelectronic workpiece 114 is brought into contact with the fluid. An advantage of this arrangement is that the microelectronic workpiece 114 forces any air between the free surface and the microelectronic workpiece 114 radially outwardly where it is less likely to form bubbles at the process surface of the microelectronic workpiece 114.

In one aspect of this embodiment, the inner vessel 1354 includes a plurality of electrodes 1330 (shown in FIG. 13 as electrodes 1330a–e). For example, the electrodes 1330 can include a central anode 1330e positioned in the main fluid flow chamber 1345. In one embodiment, the central anode 1330e is positioned proximate to a plurality of venturi flow paths 1341 which connect with the acceleration channel 1331. Fluid flow passing through the acceleration channel 1331 draws fluid downwardly away from the central anode 1330e and sweeps gas bubbles away from the surface of the central anode 1330e. In one aspect of this embodiment, the flow passing through the venturi flow path also controls the uniformity of the flow passing upwardly through the main fluid flow chamber 1345 and accordingly controls the uniformity of the flow impinging on the central portion of the microelectronic workpiece 114.

In one embodiment, the inner vessel 1354 further includes a plurality of generally annularly shaped electrodes (four are shown in FIG. 13 as electrodes 1330a–d). If the microelectronic workpiece 114 is small and does not extend radially outwardly beyond the contoured sidewall 1338, no power need be applied to the annular anodes 1330a–d. If the microelectronic workpiece 114 extends radially beyond the contoured sidewall 1338, one or more of the annular electrodes 1330a–d is powered to provide plating at the outer portions of the microelectronic workpiece 114. The power applied to the annular electrodes 1330a–d is the same in one embodiment, and in another embodiment, each electrode 1330a–d receives a different power depending upon the initial characteristics of the microelectronic workpiece 114 and/or the result to be obtained by the electrochemical deposition process. In one embodiment, the electrochemical deposition rate is also controlled by the weir 1359, which can include a transverse portion 1358 extending radially inwardly over a portion of some or all of the annular electrodes 1330a–d. The weir 1359, along with the transverse portion 1358, may be easily removed from the rest of the inner vessel 1354 to tailor the extent to which the transverse portion 1358 shields the microelectronic workpiece 114.

In other embodiments, the vessel assembly 1352 has other arrangements. Further details of the arrangement shown in FIG. 13, as well as alternate arrangements, are included in International Application No. PCT/US00/10210, filed Apr. 13, 2000 and incorporated herein in its entirety by reference.

FIG. 14 is a schematic illustration of a multi-electrode vessel assembly 1452 in accordance with another embodiment of the invention. In one aspect of this embodiment, the vessel assembly 1452 includes an inner vessel 1454 disposed annularly inwardly within an outer vessel 1453. A helical drain channel 1440 between the inner vessel 1454 and the outer vessel 1453 receives fluid overflowing the inner vessel 1454 and guides the fluid toward a fluid outlet 1444 in a manner generally similar to that described above with reference to FIG. 13. Fluid enters the inner vessel 1454 through a primary fluid inlet 1432a and a secondary fluid inlet 1432b. The primary fluid inlet 1432a is coupled to a primary flow channel 1478 that directs a portion of the fluid within the inner vessel 1454 to a primary flow guide 1475. In one embodiment, the primary flow guide 1475 includes nozzles or apertures 1479 that direct the flow toward the central axis of the inner vessel 1454. The flow proceeds upwardly from the primary flow guide 1475 toward the microelectronic workpiece 114.

In one embodiment, the secondary fluid inlet 1432 is coupled to a distributor 1470 that directs the secondary fluid to a plurality of electrodes. In one aspect of this embodiment, the inner vessel 1454 includes four electrodes 1430 (shown in FIG. 14 as electrodes 1430a–1430d). In one aspect of this embodiment, the electrodes 1430 are housed in a field shaping unit 1476 having a corresponding plurality of electrode compartments 1471 (shown as compartments 1471a–1471d) separated by partitions 1472. The distributor 1470 directs the secondary fluid into each compartment 1471 via a corresponding plurality of distributor channels 1470 (shown as distributor channels 1470a–1470d). Accordingly, the secondary fluid proceeds through the distributor 1470, past the electrodes 1430, and upwardly toward the microelectronic workpiece 114. The effect of the field shaping unit 1476 on the electrical field produced by the electrodes 1430 is as if the electrodes were positioned at the exits of each compartment 1471, as shown by virtual electrode positions 1480a–1480d.

In one aspect of an embodiment of the vessel assembly 1452 shown in FIG. 14, each compartment 1471 has an aperture 1474 through which fluid and gas bubbles pass. Accordingly, gas bubbles trapped in each compartment 1471 proceed radially outwardly through the apertures 1471 of each compartment until they exit the inner vessel 1454. In another aspect of this embodiment, each compartment 1471 includes an interface member 1477 (which is eliminated in an alternate embodiment). In one embodiment, the interface members 1477 include a filter configured to trap air bubbles and other particulates, while allowing the secondary fluid to pass toward the microelectronic workpiece 114. In another embodiment, the interface members 1477 can include ion membranes that allow ions to pass toward the microelectronic workpiece 114, while preventing or substantially preventing the secondary fluid from passing toward the microelectronic workpiece 144. Instead, the secondary fluid passes through the apertures 1474 and out of the inner vessel 1454 via the helical drain channel 1440. In another embodiment, the ion membrane allows the fluid as well as ions to pass through.

In one embodiment in which the primary and secondary fluids are separated, the primary fluid (which contacts the microelectronic workpiece 114) includes a catholyte and the secondary fluid (which does not contact the microelectronic workpiece 114) includes a separate anolyte. An advantage of this arrangement is that it eliminates the consumption of additives at the anodes and thus the need to replenish the additives as often as is required in a conventional arrangement. This feature, in combination with the "virtual anode" aspect of the vessel assembly 1452 can reduce the need to "burn-in" anodes, which is typically required to ensure a consistent black film over the anodes to provide a predictable current distribution. Instead, the current distribution is controlled by the configuration of the field shaping unit 1476.

In other embodiments, the vessel assembly 1452 has other arrangements. Further details of aspects of the embodiment described above with reference to FIG. 14 and alternate arrangements are included in International Application No. PCT/US00/10120, filed Apr. 13, 2000, incorporated herein by reference, and the following U.S. Patent Applications, all of which are incorporated herein by reference: Ser. No. 09/872,151, filed May 31, 2001; Ser. No. 09/804,696 filed Mar. 12, 2001; Ser. No. 09/804,697 filed Mar. 12, 2001; Ser. No. 09/875,365, filed Jun. 5, 2001; Ser. No. 09/849,505 filed May 4, 2001; Ser. No. 09/866,391 filed May 24, 2001; Ser. No. 09/866,463 filed May 24, 2001; and Ser. No. 10/008,636 filed Dec. 5, 2001.

Electroless Processing Station

Figure 15:
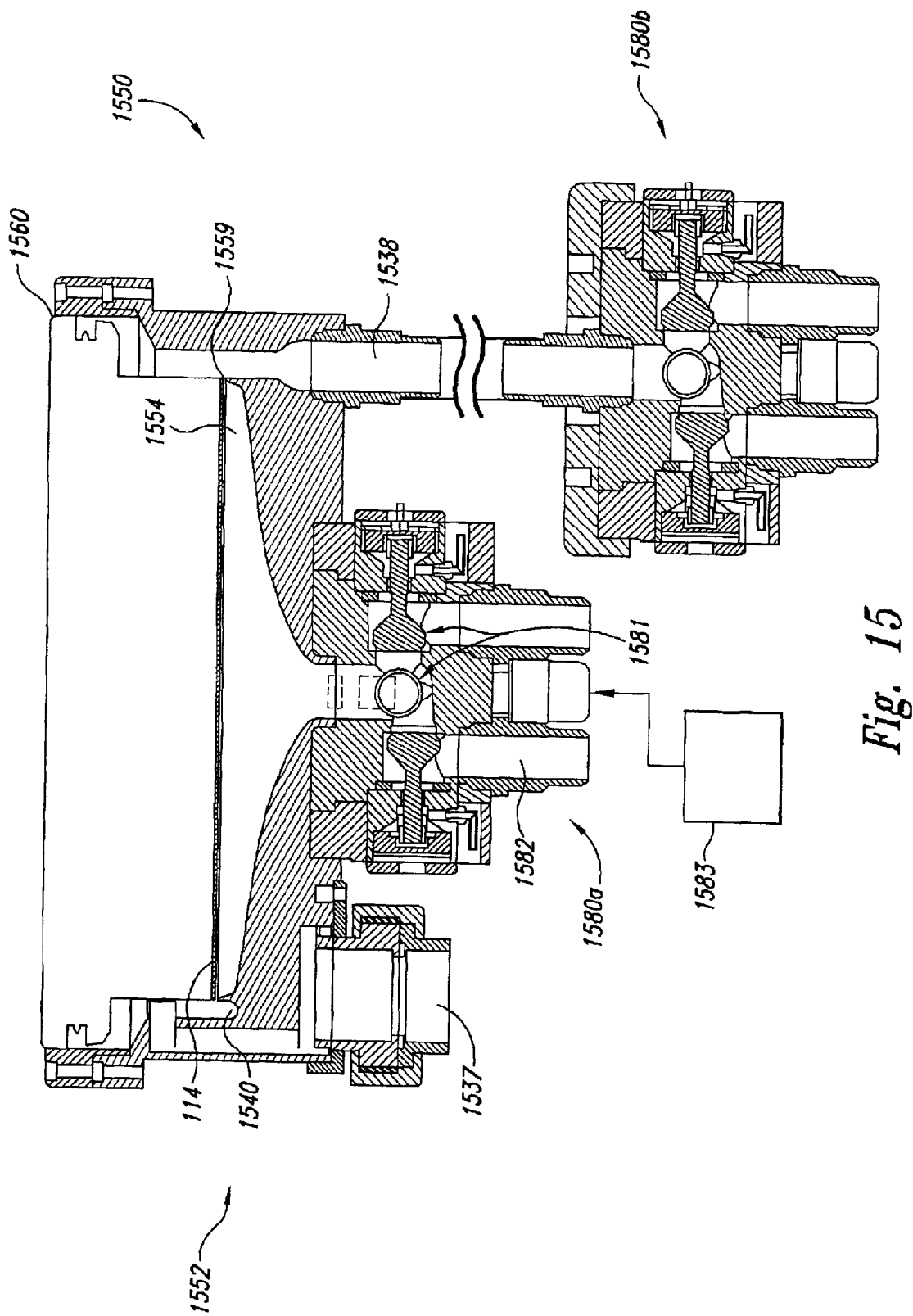
FIG. 15 is a partially schematic illustration of an electroless processing station in accordance with an embodiment of the invention.

FIG. 15 is a partially schematic, cross-sectional side view of a processing station 1550 configured for electroless processing in accordance with an embodiment of the invention. In one aspect of this embodiment, the processing station 1550 includes a vessel assembly 1552 having a processing portion 1554 configured to receive an electroless processing fluid through a supply valve assembly 1580a. A fluid heater 1583 (shown schematically in FIG. 15) is coupled in fluid communication with the supply valve assembly 1580a to heat the fluid entering the vessel assembly 1552. In one embodiment, the fluid is heated to a temperature of from about 50° C. to about 80° C. (for example, to electrolessly plate nickel or copper) and in other embodiments, the fluid is heated to other temperatures. In alternate embodiments, the electroless fluid is introduced at ambient temperatures. In one embodiment, the processing portion 1554 includes a weir 1559 over which the processing fluid spills into a circumferentially extending overflow channel 1540. The overflow channel 1540 is coupled to a waste valve assembly 1580b via an overflow conduit 1538 to remove processing fluid from the processing station 1550.

In one aspect of this embodiment, the supply valve assembly 1550a includes three supply valves 1581 (two of which are visible in FIG. 15) to supply three different processing fluids during different phases of the operation of the processing station 1550. A drain valve 1582 is positioned beneath the supply valves 1581 to more completely drain the supply valve assembly 1580a. In one embodiment, the waste valve assembly 1580b has an arrangement generally similar to that of the supply valve assembly 1580a to return the different processing fluids to the appropriate reservoirs (not shown).

In one embodiment, the processing station 1550 includes an exhaust conduit 1537 positioned to remove gaseous waste products when a support 1560 (shown in outline in FIG. 15) carrying the microelectronic workpiece 114 is received in the vessel assembly 1552. In one aspect of this embodiment, the support 1560 is generally similar to the support 1160 described above with reference to FIG. 11, but need not include the contact assembly 1170 (FIG. 11). Accordingly, the support 1560 supports the microelectronic workpiece 114 in contact with the electroless processing fluid in the vessel assembly 1552.

In a method in accordance with one embodiment, an electroless processing fluid, heated or unheated, is directed into the processing portion 1554 via the supply valve assembly 1580a. The support 1560 is moved downwardly to contact the microelectronic workpiece 114 with the processing fluid in the processing portion 1554. An electroless, wet chemical deposition process occurs at the interface between the microelectronic workpiece 114 and the processing fluid in the processing portion 1554 to deposit conductive material on the microelectronic workpiece 114. The electroless process can be used to dispose a variety of conductive structures onto the microelectronic workpiece 114, such as seed layer enhancement and/or repair material, blanket layers, or other conductive structures. Alternatively, the station 1550 can be used to dispose other, nonconductive materials on the microelectronic workpieces 114. In a further alternate embodiment, the station 1550 is used to remove material from the microelectronic workpiece 114. For example, in another embodiment, the electroless processing station 1550 or a station having a generally similar configuration is used to etch material from the backside of the wafer. In an alternative arrangement, a processing station that directs flow toward the microelectronic workpiece from two directions is used to remove material from the microelectronic workpiece 114, as described in greater detail below with reference to FIG. 16.

Removal Stations

Figure 16A:
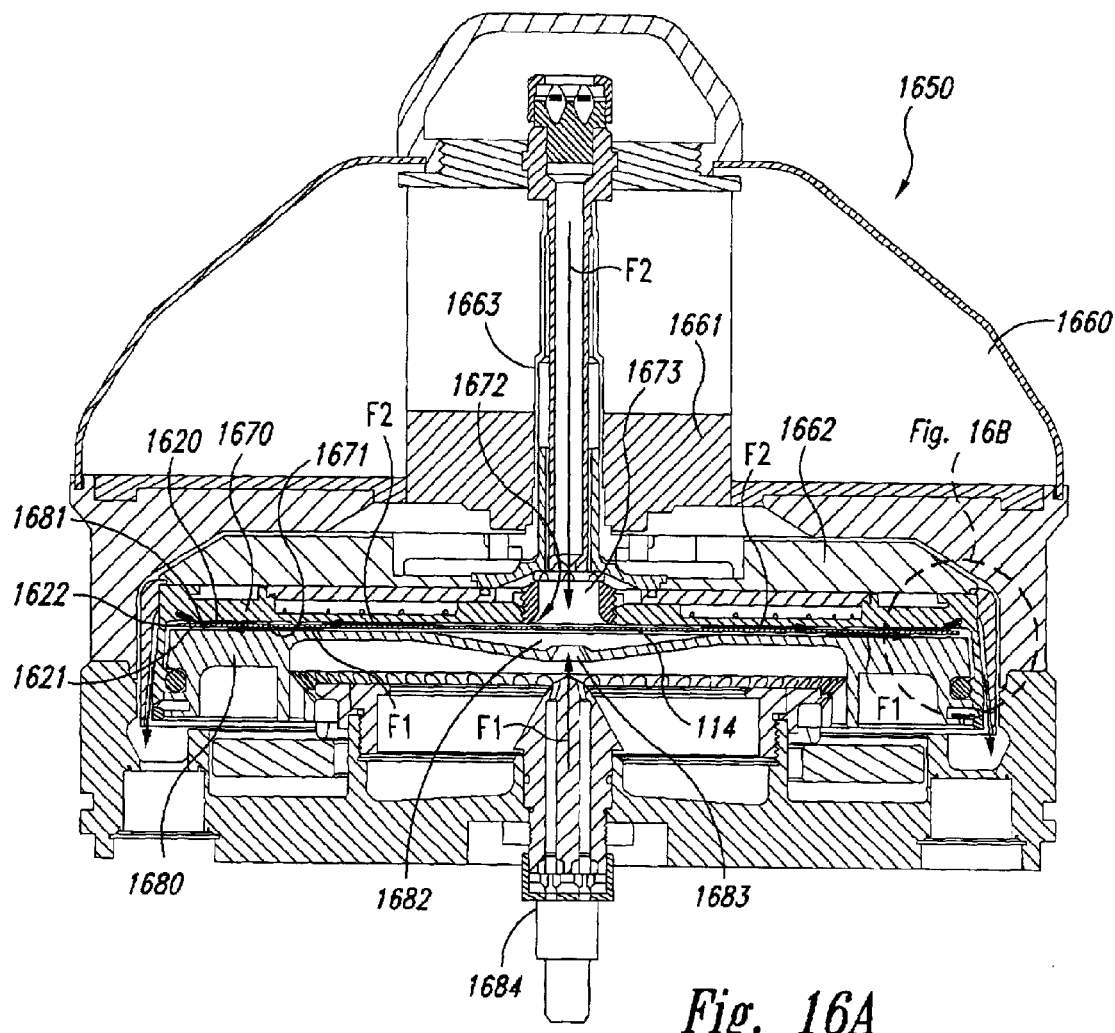
FIGS. 16A–B are partially schematic illustrations of a station configured to remove material from a microelectronic workpiece in accordance with an embodiment of the invention.
Figure 16B:
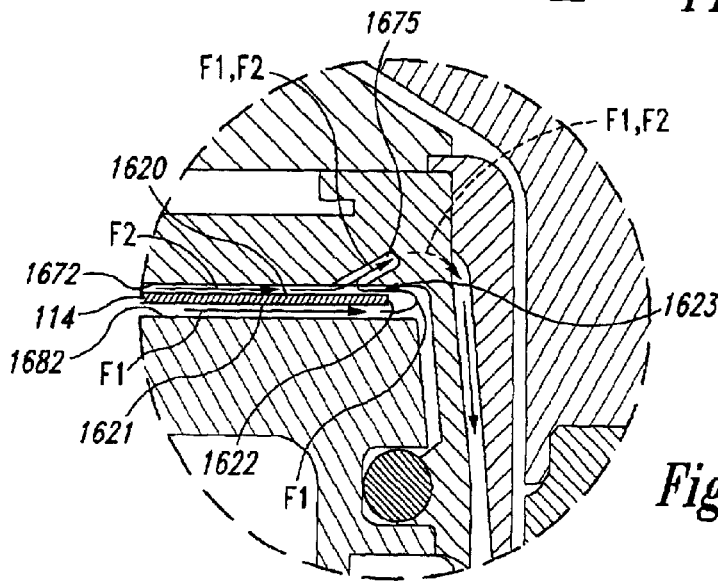

FIGS. 16A–B are partially schematic illustrations of a material removal station 1650 in accordance with an embodiment of the invention. The material removal station 1650 or "stripping unit" is a multifunctional processing capsule which performs cleaning, stripping, bevel etching, rinsing and drying operations. In one aspect of this embodiment, the station 1650 is used to remove seed layer material from the front or device side of the microelectronic workpiece 114. Alternatively, the station 1650 is used to remove conductive material and/or nonconductive material from either the front/device side of the microelectronic workpiece 114 or the back/non-device side of the microelectronic workpiece 114. In either embodiment, the capsule can include flows of different fluids directed to opposing sides of the microelectronic workpiece 114 to control the amount of material removed from the microelectronic workpiece 114.

Referring first to FIG. 16A, a station 1650 in accordance with one embodiment includes a support 1660 having a motor 1661 coupled to a rotor 1662 with a drive shaft 1663 to rotate the rotor 1662. The rotor 1662 includes an upper chamber member 1670 and a lower chamber member 1680. The upper chamber member 1670 can be separated from the lower chamber member 1680 (for example, by moving the support 1660 upwardly) to allow the microelectronic workpiece 114 to be positioned therebetween. In one aspect of this embodiment, the upper chamber member 1670 includes an upper chamber wall 1671 which defines an upper chamber 1672 positioned proximate to an upper surface 1620 of the wafer 114. The lower chamber member 1680 includes a lower chamber wall 1681 that defines a lower chamber 1682 facing toward a lower surface 1621 of the microelectronic workpiece 114.

In operation, a first fluid (schematically indicated by arrows F1) is introduced into the station 1650 via an injection nozzle 1684 (such as a multi-port injection nozzle), through a lower chamber inlet 1683 and into the lower chamber 1682. A second fluid (schematically illustrated by arrows F2) is introduced to the upper chamber 1672 through an upper chamber inlet 1673.

Referring now to FIG. 16B, the first fluid F1 proceeds outwardly along the lower surface 1621 of the microelectronic workpiece 114 while the second fluid F2 proceeds radially outwardly along the upper surface 1620 as the microelectronic workpiece 114 spins. In one aspect of this embodiment, the upper chamber member 1670 includes an exit duct 1675 positioned radially inwardly from an outer edge 1622 of the microelectronic workpiece 114. Accordingly, the first fluid F1 proceeds around the outer edge 1622 and over a peripheral margin 1623 of the upper surface 1620 before merging with the second fluid F2 and proceeding through the exit duct 1675. In an alternate embodiment, the exit duct 1675 is blocked or relocated so that the first fluid F1 does not wrap around to the upper surface 1620 of the microelectronic workpiece 114.

In some applications, it may be desirable to etch material from the lower surface 1621 while preventing etching from occurring on the upper surface 1620, except for the peripheral margin 1623. Accordingly, in one aspect of this embodiment, the first fluid F1 is selected to include an etchant, and the second fluid F2 includes an inert liquid, such as deionized water. An advantage of removing material from the peripheral margin 1623 is that this may reduce the likelihood for film flaking and contamination problems that may occur during subsequent processing of the microelectronic workpiece 114. Further details of aspects of the stations 1650 are described in International Application Nos. PCT/US99/05676, filed Mar. 15, 1999, and PCT/US99/05674, filed Mar. 15, 1999, both incorporated herein in their entireties by reference.

Spray Station

Figure 17:
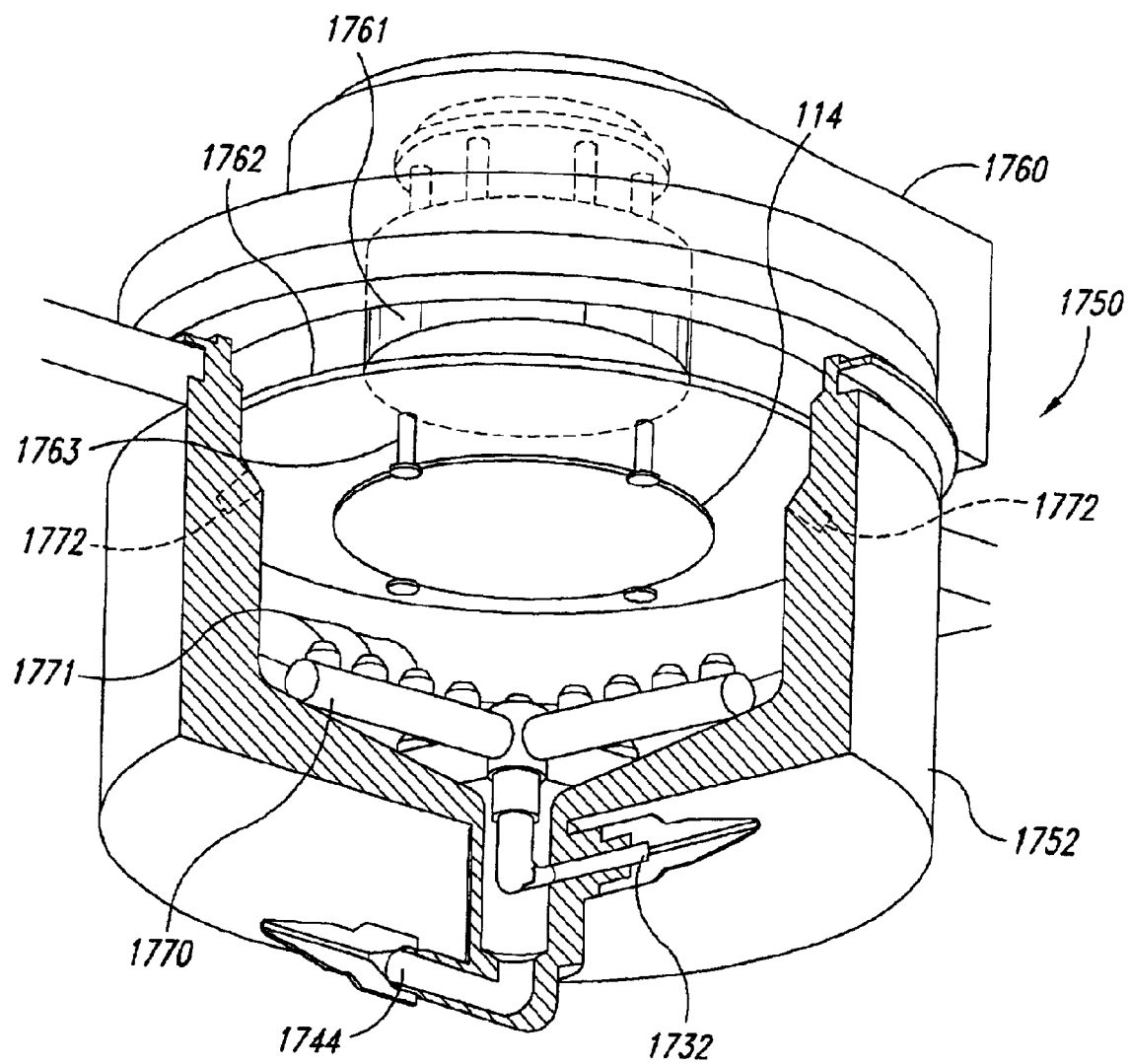
FIG. 17 is a partially schematic, isometric cutaway view of a station for spraying microelectronic workpieces in accordance with an embodiment of the invention.
Figure 18:
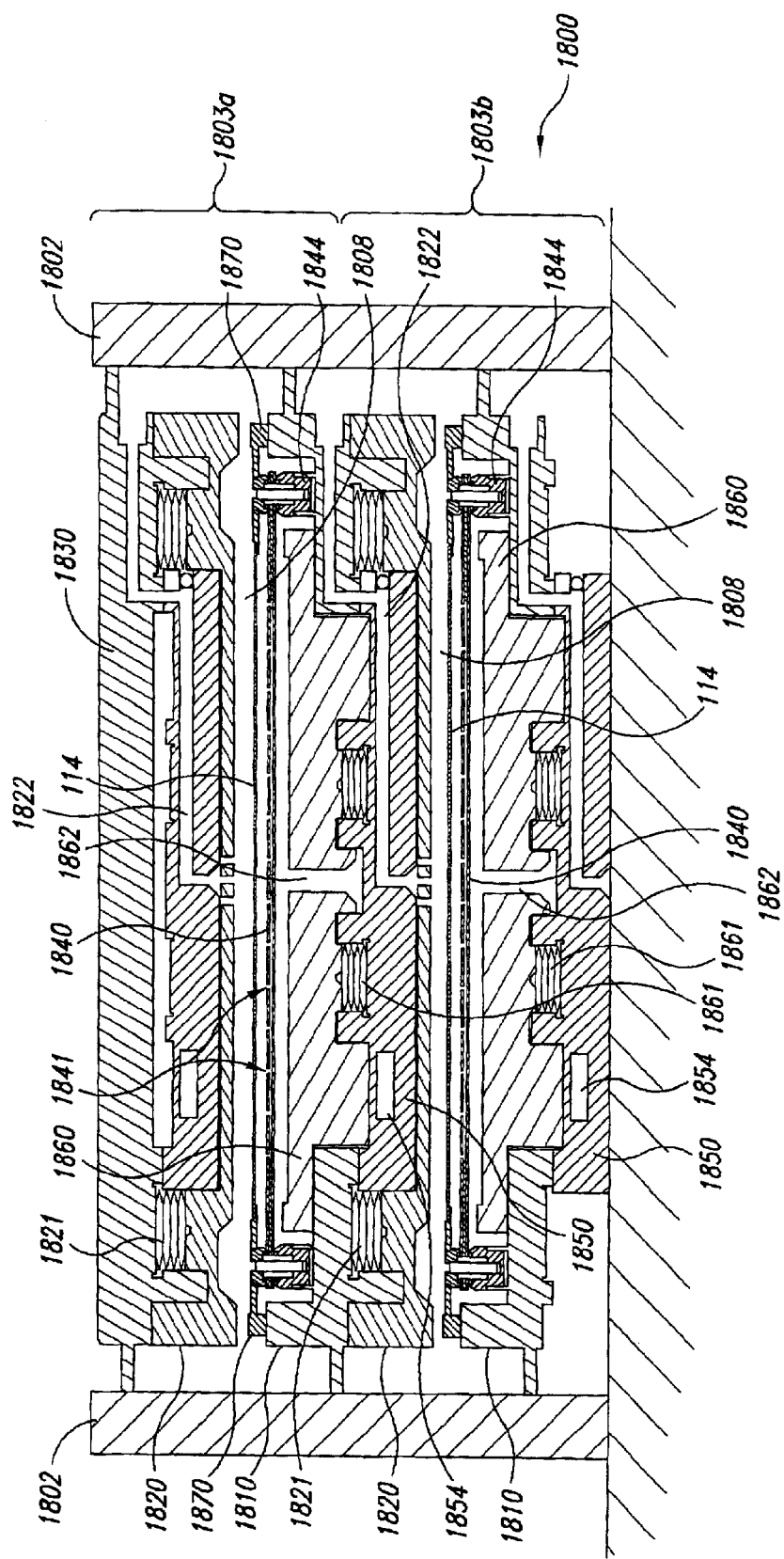
FIG. 18 is a partially schematic, cross-sectional view of a station for thermally processing microelectronic workpieces in accordance with still another embodiment of the invention.

FIG. 17 is a partially schematic, cut-away isometric view of a spray station 1750 configured to spray one or more selected fluids onto the microelectronic workpiece 114 in accordance with an embodiment of the invention. In one aspect of this embodiment, the fluid strips or etches layers from the microelectronic workpiece 114. For example, oxide, polysilicon, nitrides, metals, epitaxial silicon, and other materials are stripped using a wet etching process. In other embodiments, the spray station performs other functions, such as cleaning, rinsing and/or drying the microelectronic workpiece 114, for example, after etching, or after other phases of processing.

In one embodiment, the spray station 1750 includes a vessel 1752 and a support 1760. The support 1760 includes a rotor 1762 having support fingers 1763 that removably carry the microelectronic workpiece 114. The rotor 1762 is coupled to a motor 1761 to spin the microelectronic workpiece 114 within the vessel 1752.

In a further aspect of this embodiment, the vessel 1752 includes a spray nozzle manifold 1770 having a plurality of main spray nozzles 1771. In one aspect of this embodiment, the spray nozzle manifold 1770 has a cross-shaped arrangement with a plurality of main spray nozzles 1771 positioned on each arm of the cross. In other embodiments, the spray nozzle manifold 1770 has other arrangements. In any of these embodiments, the spray nozzle manifold 1770 is coupled to a fluid inlet 1732 to supply fluid to the main spray nozzles 1771.

Accordingly, the main spray nozzles 1771 direct the fluid upwardly toward the microelectronic workpiece 114 as the microelectronic workpiece 114 spins. A drain 1744 collects the spent fluid for removal from the vessel 1752.

In another aspect of this embodiment, the vessel 1752 further includes side spray nozzles 1772 positioned around the periphery of the vessel 1752. The side spray nozzles 1772 are configured to rinse the microelectronic workpiece 114 after the main spray nozzles 1771 have been activated, for example, to rinse the microelectronic workpiece 114 after etching. In a further aspect of this embodiment, the side spray nozzles 1772 are also coupled to a gas source, such as an inert gas source, to dry the microelectronic workpiece 114 after rinsing.

Thermal Processing Station

FIG. 18 is a partially schematic side view of an apparatus 1800 for thermally processing microelectronic workpieces 114 in accordance with an embodiment of the invention. In one aspect of this embodiment, the apparatus 1800 includes two thermal processing chambers 1803 (shown as an upper chamber 1803a and a lower chamber 1803b) supported by apparatus supports 1802. Each chamber 1803 has a base 1810 fixed to the supports 1802, and lid 1820 that moves toward and away from the base 1810 to close and open the chamber 1803. The workpiece 114 is supported within the chamber 1803 on a plurality of workpiece supports 1870. In one aspect of this embodiment, the apparatus 1800 anneals a selected material (such as copper or another metal) of the workpiece 114. Alternatively, the apparatus 1800 performs other elevated temperature processes, such as reflowing solder on the workpiece 114, curing or baking photoresist on the workpiece 114, and/or other processes that benefit from and/or require an elevated temperature. The apparatus can also cool the workpiece 114, as described in greater detail below.

In one embodiment in which the apparatus 1800 both heats and cools the workpiece 114, the supports 1870 first lowers the workpiece 114 into contact with a heat source 1840 during a heating phase of the process. Then, during a cooling phase of the process, a first heat sink 1860 rises to engage an opposite surface of the heat source 1840 to cool both the heat source 1840 and the workpiece 114. After the cooling phase, the first heat sink 1860 descends to engage a second heat sink 1850 where the first heat sink 1860 is cooled in preparation for another cycle. The lid 1820 then moves away from the base 1810 and the workpiece 114 can be removed. In one aspect of this embodiment, the heat source 1840 includes an electrical resistance thin film or thick film heater positioned between the workpiece 114 and the first heat sink 1860, with the first heat sink 1860 positioned beneath the heat source 1840. The heat source 1840 includes vacuum apertures 1841 coupled to a vacuum source (not shown) to draw the microelectronic workpiece 114 into close engagement with the heat source 1840 during heating. For example, in one embodiment, the heat source 1840 is supported relative to the base 1810 with a plurality of heat source supports 1844, at least one of which includes a vacuum passage in fluid communication with the vacuum apertures 1841.

In one embodiment, the lid 1820 of each chamber 1803 is coupled to a lid actuator 1821 to move downwardly from an open position (shown in FIG. 18) to a closed position. The lid actuator 1821 of the upper chamber 1803a is attached to the cover 1830, and the lid actuator 1821 of the lower chamber 1803b can be attached to the base 1810 of the upper chamber 1803a. In one embodiment, each lid actuator 1821 includes an annular, air-activated bellows that moves the lid 1820 downwardly when inflated. A spring (not shown) can return the lid 1820 to the open (upper) position when the air pressure within the bellows is released. When the lid 1820 is in the closed position, the lid 1820 and the base 1810 define a chamber volume 1808 around the microelectronic workpiece 114. The lid 1820 can include a purge fluid passageway 1822 that transmits a purge fluid (such as nitrogen) to the chamber volume 1808 during processing.

In one embodiment, the first heat sink 1860 is coupled to a heat sink actuator 1861 that moves the first heat sink 1860 upwardly into engagement with the heat source 1840. In one embodiment, the heat sink actuator 1861 includes an air-driven bellows, generally similar to the lid actuator 1821 discussed above. In other embodiments, the heat sink actuator 1861 has other configurations that move the first heat sink 1860 upwardly into engagement with the heat source 1840 and downwardly out of engagement with the heat source 1840.

In a further aspect of this embodiment, the first heat sink 1860 includes a vacuum supply passageway 1862 connected to a vacuum source (not shown). The vacuum supply passageway 1862 is coupled to one or more radial vacuum channels in an upper surface of the first heat sink 1860 to draw the first heat sink 1860 into close thermal contact with the heat source 1840 when the heat source 1840 and the first heat sink 1860 are engaged with each other. The upper surface of the first heat sink 1860 can also include a compressible, conductive thermal pad to provide close thermal contact with the heat source 1840 when the first heat sink 1860 is in its raised position. In another aspect of this embodiment, the lower surface of the first heat sink 1860 includes a compressible, conductive thermal pad to improve the thermal contact with the second heat sink 1850.

In one embodiment, the first heat sink 1860 has no active cooling elements. Instead, the second heat sink 1850 is actively cooled and cools the first heat sink 1860 when the first heat sink 1860 is disengaged from the heat source 1840 and engaged with the second heat sink 1850. Accordingly, the second heat sink 1850 includes a cooling channel 1854 coupled to a cooling fluid supply port and a return port (not shown).

In other embodiments, the apparatus 1800 has other arrangements. For example, in one embodiment, the apparatus 1800 includes a simpler hot plate arrangement for applications where the process temperature and environment need to be so precisely controlled. In other embodiments, the apparatus includes heat sources other than electrically powered resistive heaters. Further details of alternate embodiments are disclosed in U.S. patent application Ser. No. 09/733,608, filed Dec. 8, 2000 and incorporated herein in its entirety by reference.

Station Combinations and Processes

Embodiments of the apparatus 100 described above with reference to FIGS. 1–8 include a variety of combinations of processing stations, such as those described above with reference to FIGS. 9–18, to perform a variety of functions on the microelectronic workpieces 114. In one aspect of these embodiments, the apparatus 100 includes a plurality of stations all of which have generally the same configuration and all of which perform generally the same function or functions. For example, in one embodiment, the apparatus 100 includes only material removal stations generally similar to those described above with reference to FIGS. 16A–B, or only thermal processing stations generally similar to that described above with reference to FIG. 18, or only deposition stations for metal or electrophoretic resist deposition, generally similar to those described above with reference to FIG. 14.

In other embodiments, the apparatus 100 includes more than one type of station to perform different functions on microelectronic workpieces 114 within the same apparatus 100. For example, in one embodiment, the apparatus 100 includes a metrology station, a material application station, a material removal station, a spray station, and an anneal station. In other embodiments, the apparatus 100 includes a subset of these types of stations. For example, in one specific embodiment, the apparatus 100 includes a multi-anode material application station generally similar to that described above with reference to FIG. 14 for plating solder onto a microelectronic workpiece 114. The apparatus also includes a spray station generally similar to that described above with reference to FIG. 17 to post-process the microelectronic workpiece 114 after it emerges from the multi-anode application station. In still a further aspect of this embodiment, the apparatus includes a pre-aligner configured to orient microelectronic workpieces 114 (such as 6 inch or 150 mm wafers having a flat edge) that are preferably processed in a specific orientation. Further details of suitable pre-aligners are included in U.S. Pat. No. 6,091,498, incorporated herein in its entirety by reference.

In other embodiments, the apparatus 100 includes other combinations of stations. For example, in a further specific embodiment, the apparatus 100 includes any one of the application stations described above with reference to FIGS. 11–15 for enhancing and/or repairing a seed layer of the microelectronic workpiece 114. The apparatus 100 further includes a material removal station generally similar to that described above with reference to FIGS. 16A–B, a multi-anode station generally similar to that described above with reference to FIG. 14 for applying a blanket material to the microelectronic workpiece 114, and a thermal processing station generally similar to that described above with reference to FIG. 18 to anneal the blanket layer applied to the microelectronic workpiece 114.

In still a further particular embodiment, the apparatus 100 is configured specifically to process electrophoretic resist on the microelectronic workpiece 114. For example, the apparatus 100 includes a multi-anode station generally similar to that described above with reference to FIG. 14 for depositing the electrophoretic resist, along with a bake chamber to post-process the electrophoretic resist. In one aspect of this embodiment, the bake chamber has a configuration generally similar to that described above with reference to FIG. 18, and in an alternate embodiment, the bake chamber is simpler and has a construction generally similar to a hot plate, to elevate the temperature of the microelectronic workpiece 114 to about 112° Celsius. The apparatus further includes a spray station generally similar to that described above with reference to FIG. 17 for further post processing.

In any of the foregoing embodiments, microelectronic workpieces are automatically moved into and/or out of any of the processing stations in an automatic mode or in a manual mode, as described above with reference to FIGS. 1–5. As described above with reference to FIGS. 1–5, some microelectronic workpieces 114 are moved manually into and/or out of selected processing stations, while other microelectronic workpieces 114 are moved automatically into other processing stations. Alternatively, the apparatus 100 can be alternately dedicated to manual operation and automatic operation. In any of these embodiments, the apparatus 100 provides a versatile platform for a testing, experimenting with, or demonstrating processes, as well as performing the same or different processes in a production setting.

C. Flow Valves for Regulation Flud Flow Rates

FIGS. 19–23 and the associated discussion below describe flow valves in accordance with embodiments of the invention, suitable for regulating flows to processing stations, such as those described above with reference to FIGS. 11–17. In other embodiments, the flow valves are installed in fluid communication with other processing stations, or in fluid lines unrelated to electrochemical processing. In many of these embodiments, one characteristic of the flow valves is that they automatically and (passively and/or actively) adjust to changes in upstream fluid pressure. Accordingly, in at least some embodiments, the valves continue to supply fluid at a constant flow rate even when the upstream pressure drops by a substantial amount.

FIG. 19 is a partially cutaway, isometric view of a valve 1930 in accordance with an embodiment of the invention. In one aspect of this embodiment, the valve 1930 includes a valve body 1940 having a cavity 1941 and a regulator 1960 disposed in the cavity 1941. In a further aspect of this embodiment, the valve body 1940 is formed from two portions threadably coupled to each other, and in other embodiments, the valve body 1940 has other arrangements. In one embodiment, the regulator 1960 includes a generally rigid piston that is movable axially within the cavity 1941 relative to the valve body 1940. In another embodiment (described in greater detail below with reference to FIG. 22), the regulator can include a diaphragm. In an embodiment shown in FIG. 19, the cavity 1941 includes a generally axial flow passage 1942 extending through the valve body 1940 along a flow axis 1947 between an entrance port 1943 and an exit port 1944. The entrance port 1943 can be coupled to a source of a first fluid (not shown in FIG. 19), such as an electrochemical processing fluid. The exit port 1944 can include smoothly contoured, fixed cross-sectional area flow restrictor 1931. The first fluid enters the valve 1930 through the entrance port 1943, travels through the valve 1930 along the flow axis 1947, through apertures 1961 of the regulator 1960, and exits the valve 1930 through the exit port 1944.

The cavity 1941 also includes a pressure chamber 1945 that is at least partially sealed from fluid communication with the flow passage 1942 by flexible membranes 1934. The pressure chamber 1945 includes a pressure port 1946 that is coupled to a source of a second fluid (not shown in FIG. 19), such as a pressurized air source. The second fluid enters the pressure port 1946 to adjust the position of the regulator 1960 (and therefore the flow rate of the first fluid through the valve 1930), as described in greater detail below.

In one embodiment, the regulator 1960 includes a first portion 1965 and a second portion 1966 that extends radially outwardly from the first portion 1965. In one aspect of this embodiment, the first portion 1965 is positioned proximate to a valve seat 1948 to define a variable minimum flow area 1949 of the flow passage 1942. As the regulator 1960 moves axially along the flow axis 1947, the first portion 1965 moves toward and away from the valve seat 1948, changing the size of the minimum flow area 1949.

The first portion 1965 of the regulator 1960 has a first surface 1962. The first fluid in the flow passage 1942 acts on the first surface 1962 to produce a force driving the regulator 1960 axially toward the exit port 1944. The value of the axial force on the regulator 1960 at the first surface 1962 is approximately equal to the product of the pressure of the first fluid proximate to the first surface 1962 and a component of the area of the first surface 1962 projected into a plane generally perpendicular to the flow axis 1947.

The first fluid travels through the apertures 1961 to act on a second surface 1963 of the second portion 1966. The fluid acting on the second surface 1963 produces a force tending to drive the regulator 1960 axially toward the entrance port 1943. The value of the axial force on the regulator 1960 at the second surface 1963 is approximately equal to the product of the pressure of the first fluid proximate to the second surface 1963 and the area of the second surface 1963 projected into a plane generally perpendicular to the flow axis 1947.

In one aspect of this embodiment, the second surface projected area is substantially larger than the first surface projected area. Accordingly, large changes in the pressure of the first fluid at the entrance port 1943 result in relatively small changes in the pressure at the exit port 1944. As a result, the rate at which the first fluid passes through the valve 1930 remains approximately constant even if the pressure at the entrance part 1943 drops substantially. In general, the change in pressure at the exit port 1944 is approximately equal to the product of the change in pressure at the entrance port 1943 and the ratio of the first surface projected area to the second surface projected area. For example, if the projected surface area ratio is 1:40 and the pressure at the entrance port 1943 drops by 10 psi, the pressure at the exit port 1944 will drop by only about 0.25 psi. Accordingly, the higher the projected surface area ratio, the less sensitive the flow rate is to changes in pressure at the entrance port 1943. In one embodiment, the projected surface area ratio is from about 1:40 to about 1:45, and in other embodiments, the projected area ratio has other values outside this range.

In one embodiment, the first fluid acts directly on the first and second surfaces 1962, 1963 of the regulator 1960. In another embodiment, portions of the first and second surfaces 1962, 1963 are isolated from the first fluid (for example, with flexible membranes or bladders). In both embodiments, the first fluid is operatively coupled to the first and second surfaces 1962, 1963 to exert forces on the regulator 1960.

In another aspect of an embodiment of the valve 1930 shown in FIG. 19, the pressure chamber 1945 is used to establish an initial value of the flow rate through the valve 1930. For example, air or another second fluid is applied to the pressure port 1946 to displace the regulator 1960 by an amount that produces the desired flow rate through the valve 1930. In a particular embodiment, the second fluid in the pressure chamber 1945 acts against a third surface 1964 of the regulator 1960 to force the regulator 1960 to a desired open setting. The second fluid in the pressure chamber 1945 is prevented from mixing with the first fluid in the flow passage 1942 by the flexible membranes 1934. In one aspect of this embodiment, the pressure chamber 1945 includes a retracting spring 1932 to reduce and/or eliminate undesirable oscillations by the regulator 1960 when the pressure at the entrance port 1943 changes. In other embodiments, the spring 1932 has other locations, or is eliminated.

In another aspect of the invention, the pressure in the pressure chamber 1945 can be actively adjusted not only to select the initial flow rate through the valve 1930, but also to further reduce the pressure loss (and associated flow rate reduction) at the exit port 1944 caused by a pressure drop at the entrance port 1943. For example, if a 10 psi drop in pressure at the entrance port 1943 produces a 0.25 psi drop at the exit port 1944 with a constant pressure in the pressure chamber 1945, the pressure within the pressure chamber 1945 can be increased slightly, moving the first portion 1965 of the regulator 1960 further away from the valve seat 1948 to increase the flow rate through the valve 1930. Accordingly, the effect of even the small pressure drop at the exit port 1944 can be further reduced and/or eliminated. As described in greater detail below with reference to FIG. 23, this process can be automated in a feedback loop arrangement.

FIGS. 20A–20C illustrate partially schematic, cross-sectional views of an embodiment of the valve 1930 with the regulator 1960 at three different positions. For example, FIG. 20A illustrates the valve 1930 in a minimum flow configuration. In this configuration, the regulator 1960 is at its closest position to the entrance port 1942 so that the minimum flow area 1949 is at its lowest setting. In one aspect of this embodiment, the first portion 1965 of the regulator 1960 seals against the valve seat 1948 to close the valve 1930. In a further aspect of this embodiment, a vacuum source is applied to the pressure port 1946 to draw the first portion 1965 tightly against the valve seat 1948. In another embodiment, a small space remains between the first portion 1965 and the valve seat 1948 even at the lowest flow setting, to reduce wear on both the valve seat 1948 and the first portion 1965 of the regulator 1960. Another valve (not shown) is then used to completely shut off the flow through the valve 1930.

FIG. 20B illustrates the valve 1930 with the regulator 1960 in an intermediate configuration. In this configuration, the first portion 1965 of the regulator 1960 is spaced apart from the valve seat 1948 to allow the first fluid to flow through the flow passage 1942 at a selected flow rate. As described above with reference to FIG. 19, the selected flow rate can be adjusted by adjusting the pressure in the pressure chamber 1945.

FIG. 20C illustrates the valve 1930 in a fully opened configuration. In this configuration, the regulator 1960 is at its closest position to the exit port 1944 so that the minimum flow area 1949 is at its highest setting. If the pressure at the entrance port 1943 continues to fall with the valve 1930 in this configuration, the flow rate through the valve 1930 will drop at an accelerated rate.

FIG. 21 illustrates a graph 2100 of flow rate as a function of entrance pressure for a fluid flow with and without a valve (such as the valve 1930) in accordance with an embodiment of the invention. Line 2101 illustrates the flow rate response to a drop in pressure without such a valve, indicating that a drop in pressure upstream of the valve produces a substantial, proportional drop in flow rate downstream of the valve. Line 2102 illustrates, by contrast, that a valve in accordance with an embodiment of the invention maintains the flow rate at near constant values, despite a substantial decrease in the pressure at the entrance of the valve. For example, as shown in FIG. 21, if the entrance pressure drops from about 15 psi to about 5 psi, the flow rate only drops from about 4.9 gallons per minute to about 4.3 gallons per minute. In the embodiment shown in FIG. 21, the valve reaches its fully opened configuration when the entry pressure drops to 5 psi, so that a further drop in upstream pressure produces an accelerated drop in flow rate, as described above. As was also described above, the pressure of the second fluid within the pressure chamber 1965 (FIG. 19) can be increased to further reduce the effect of an upstream pressure drop, at least until the valve reaches its fully opened configuration. This method of operation is shown in line 2103, which indicates that the flow rate can remain at an approximately constant level as the upstream pressure drops from about 15 psi to about 5 psi.

FIG. 22 illustrates a generally axisymmetric valve 2230 having an arrangement in accordance with another embodiment of the invention, and an effect on flow rate generally similar to that described above with reference to FIG. 21. In one aspect of this embodiment, the valve 2230 includes a valve body 2240 having a cavity 2241 in which a regulator 2260 is positioned. The regulator 2260 has a flexible diaphragm configuration and is secured to the valve body 2240 by flanges 2267. The regulator 2260 includes a first portion 2265 that moves toward and away from a valve seat 2248 to adjust a minimum flow area 2249. Flow passes through the valve 2240 from an entrance port 2243, through a flow passage 2242 along a flow axis 2247, through an aperture 2261 of the regulator 2260 and to an exit port 2244. The regulator 2260 includes a first surface 2262 having a projected area that is substantially less than a projected area of an oppositely facing second surface 2263. The regulator 2260 is at least partially flexible and accordingly flexes between a first configuration (shown in solid lines in FIG. 22) and a second configuration (shown in dashed lines in FIG. 22). As the regulator 2260 moves from the first configuration to the second configuration, the first portion 2265 of the regulator 2260 moves away from the valve seat 2248 to increase the flow area through the minimum area section 2249 until an equilibrium is reached, with the flow rate through the valve 2230 remaining at least approximately the same despite a substantial drop in pressure at the entrance port 2243.

The cavity 2241 also includes a pressure chamber 2245 having a pressure port 2246a and, optionally, a pressure relief port 2246b. A pressurized second fluid supplied to the pressure port 2246a acts on a third surface 2264 of the regulator 2260 to flex the third surface 2264 inwardly and adjust the initial flow rate through the valve 2230. In one embodiment, the pressure relief port 2246b includes a flow restrictor to maintain an elevated pressure within the pressure chamber 2245. Alternatively, the pressure relief port 2246b and the flow restrictor positioned in it can be eliminated.

An advantage of an embodiment of the flow valve 2230 described above with reference to FIG. 22 is that the flexible regulator 2260 can be less susceptible to damage caused by friction between moving components. An advantage of an embodiment of the flow valve 1930 described above with reference to FIGS. 19–20C is that the rigid regulator 1960 may be more robust and less subject to elastic fatigue. An advantage of both embodiments of the valve is that the movement of the regulator passively maintains a relatively constant flow rate through the valve despite a substantial decrease in entrance pressure.

FIG. 23 is a schematic illustration of a portion of an apparatus 2300 that is generally similar to the apparatus 100 described above with reference to FIG. 1 and that includes a plurality of valves 1930 generally similar to those described above with reference to FIGS. 19–20C. In another embodiment, the apparatus 2300 includes valves 2230 generally similar to those described above with reference to FIG. 22. In either embodiment, the valves are positioned to provide a generally constant fluid flow rate to processing stations of the apparatus 2300, as described below.

In one aspect of an embodiment shown in FIG. 23, the apparatus 2300 includes six processing stations 150, each of which includes a fluid vessel 152. The vessels 152 can be arranged in two groups of three, each of which is supplied with a first fluid from a corresponding reservoir 2311. The first fluid is withdrawn from each reservoir 2311 by a pump 2312 and is filtered for particulate and other contaminants by a filter 2313. The first fluid then passes into a manifold 2314. Separate lines direct the first fluid from the manifold 2314 to a valve 1930 that is coupled to the corresponding vessel 152. In one aspect of this embodiment, a flow meter 2315 is positioned in each line between the manifold 2314 and the corresponding vessel 152.

In one embodiment, the apparatus 2300 also includes a second fluid source 2317 that provides fluid to the pressure chambers 1945 (FIG. 19) of each valve 1930. Each valve 1930 can also include a pressure adjuster 2316 that adjusts the pressure of the second fluid entering the valve 1930, and accordingly, adjusts the initial flow setting for each valve 1930. In a further aspect of this embodiment, signals from the flow meter 2315 can be automatically directed to the pressure adjuster 2316 to adjust the pressure within the pressure chamber 1945 as the pressure of the first fluid upstream of the valve 1930 drops, further reducing the effect of any pressure drops upstream of the valve 1930 in a manner generally similar to that described above with reference to FIG. 19.

In one embodiment, the initial flow rates for each of the valves 1930 can be set manually, and the valves can then automatically compensate for upstream pressure drops. In another embodiment, a controller 2310 is coupled to each of the pressure adjusters 2316. In one embodiment, the controller 2310 is coupled to the graphical user interface 107 (FIG. 1), and is coupled to and/or integrated with the processor 106 (FIG. 1). Accordingly, a user can individually select the initial flow rate through each of the valves 1930 with the controller 2310 and can then allow the valves 1930 (with or without the feedback loop provided by the flow meter 2315 and the pressure adjuster 2316) to adjust for upstream pressure drops.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. An apparatus for processing microelectronic workpieces, comprising:

at least one processing station configured to apply material to a microelectronic workpiece, the at least one processing station having a vessel configured to receive an electrochemical processing fluid;

a reservoir configured to carry the electrochemical processing fluid, the reservoir being in fluid communication with the vessel; and a valve coupled in fluid communication between the reservoir and the vessel to regulate a flow of the electrochemical processing fluid between the reservoir and the vessel, the valve including:

a valve body having an entrance port coupled in fluid communication with the reservoir, an exit port coupled in fluid communication with the vessel, and a flow passage in fluid communication with the entrance port and the exit port, the valve body further having a pressure chamber with a pressure port coupleable to a source of pressurized fluid, with fluid communication between the flow passage and the pressure chamber being at least partially restricted; and a regulator movably disposed in the flow passage, the regulator having a first surface with a first projected area and a second surface with a second projected area facing opposite from the first projected area, the second projected area being larger than the first projected area, the first and second surfaces being positioned to be operatively coupled to the electrochemical processing fluid when the electrochemical processing fluid is in the flow passage, the regulator further having a third surface positioned to be operatively coupled to the pressurized fluid when the pressurized fluid is in the pressure chamber.

2. The apparatus of claim 1 wherein the processing station is a first processing station, the vessel is a first vessel, the valve is a first valve, and wherein the apparatus further comprises:

a second processing station having a second vessel configured to receive the electrochemical processing fluid;

a manifold coupled between the reservoir and the first and second vessels, wherein the first valve is coupled between the manifold and the first vessel; and a second valve coupled between the manifold and the second vessel, the second valve having a configuration at least generally similar to a configuration of the first valve.

3. The apparatus of claim 1 wherein the processing station is a first processing station, the vessel is a first vessel, the valve is a first valve, and wherein the apparatus further comprises:

a second processing station having a second vessel configured to receive the electrochemical processing fluid;

a manifold coupled between the reservoir and the first and second vessels, wherein the first valve is coupled between the manifold and the first vessel;

a second valve coupled between the manifold and the second vessel, the second valve having a configuration at least generally similar to a configuration of the first valve;

a first flow meter operatively coupled to the first valve to detect a flow rate of the electrochemical processing fluid through the first valve;

a second flow meter operatively coupled to the second valve to detect a flow rate of the electrochemical processing fluid through the second valve; and a controller operatively coupled to at least one of the first and second flow meters and the pressure chamber of at least one of the first and second valves to adjust a pressure in at least one pressure chamber when an actual flow rate through the at least one of the valves differs from a target flow rate through the at least one valve by more than a selected amount.

4. The apparatus of claim 1, further comprising an input/output station configured to support at least one microelectronic workpiece for automatic transfer to and from the at least one processing station.

5. The apparatus of claim 1 wherein the at least one processing station is one of a plurality of processing stations, and wherein all the processing stations of the apparatus are manually accessible to a user to manually load microelectronic workpieces for processing.

6. The apparatus of claim 1 wherein the vessel is a first vessel and has a weir to define a level of the electrochemical processing fluid, and wherein the processing station further comprises:

a second vessel disposed around the first vessel to receive the electrochemical processing fluid proceeding over the weir;

a workpiece support positioned to carry the microelectronic workpiece in contact with the electrochemical processing fluid in the first vessel;

a first electrode support positioned in the first vessel and configured to carry a first electrode; and a second electrode support carried by the workpiece support and positioned to carry a second electrode in contact with the microelectronic workpiece when the workpiece support carries the microelectronic workpiece.

7. The apparatus of claim 1 wherein the processing station further comprises:
one or more electrode supports positioned in the vessel and configured individually or together to carry a plurality of first electrodes; and
a workpiece support positioned at least proximate to the vessel to carry the microelectronic workpiece in contact with the electrochemical processing fluid in the vessel, the workpiece support being configured to carry at least one second electrode in contact with the microelectronic workpiece when the workpiece support carries the microelectronic workpiece.

8. The apparatus of claim 1 wherein the vessel includes:
an outer container having an outer wall;
a first inlet configured to introduce a primary flow into the outer container;
at least one second inlet configured to introduce a secondary flow into the outer container separate from the primary flow; and
a dielectric field shaping unit in the outer container coupled to the second inlet to receive the secondary flow, the field shaping unit being configured to contain the secondary flow separate from the primary flow through at least a portion of the outer container, and the field shaping unit having at least one electrode compartment through which the secondary flow can pass while the secondary flow is separate from the primary flow, the electrode compartment being configured to receive at least one electrode.

9. The apparatus of claim 1, further comprising a metrology station having:
a support configured to releasably carry the microelectronic workpiece;
a measurement device positioned at least proximate to the support and configured to detect a characteristic of a conductive material of the microelectronic workpiece; and
an output device operatively coupled to the measurement device to transmit an output signal corresponding to the detected characteristic of the conductive material of the microelectronic workpiece.

10. The apparatus of claim 1 wherein the processing station is a first processing station and the vessel is a first vessel, and wherein the apparatus further comprises:
a second vessel configured to carry a spray fluid;
a support positioned proximate to the second vessel, the support being configured to carry the microelectronic workpiece; and
a fluid manifold positioned within the second vessel, the fluid manifold being coupleable to a source of the spray fluid, the fluid manifold having a plurality of fluid jets directed toward the support to spray the microelectronic workpiece with the spray fluid.

11. The apparatus of claim 1, further comprising a material removal station, the material removal station including a rotor having a first rotor portion and a second rotor portion facing toward the first rotor portion, the first and second rotor portions defining a material removal chamber configured to removably receive the microelectronic workpiece, wherein the first rotor portion includes a first rotor passage having a first aperture directed into the material removal chamber and facing the second rotor portion, the first aperture being coupleable to source of a first fluid, and wherein the second rotor portion includes a second rotor passage having a second aperture directed into the material removal chamber and facing the first portion, the second aperture being coupleable to a source of a second fluid.

12. The apparatus of claim 1, further comprising a thermal processing station, the thermal processing station having:
a base;
a support carried by the base and configured to removably contact the microelectronic workpiece;
a lid proximate to the base, at least one of the base and the lid being movable relative to the other between a closed position and an open position, the lid and the base defining a thermal processing space when in the closed position;
a heater positioned between the base and the lid;
a first heat sink positioned proximate to the heater and movable relative to the heater between a first position with the first heat sink in thermal contact with the heater and a second position with the first heat sink spaced apart from the heater; and
a second heat sink positioned proximate to the first heat sink, the second heat sink being in thermal contact with the first heat sink when the first heat sink is in the second position.

13. The apparatus of claim 1 wherein the processing station is one of a plurality of processing stations arranged along a generally straight first line and wherein the apparatus further comprises:
a transfer device having a robot configured to move along a second line generally parallel with the first line;
an enclosure disposed around at least one of the processing stations, the enclosure having a first access aperture through which the user can manually access all the processing stations, the enclosure having a second access aperture accessible to the robot and through which the robot can move microelectronic workpieces, with the second line being positioned between the first line and the first and second access apertures.

14. The apparatus of claim 1 wherein the processing station is one of a plurality of processing stations, and wherein all the processing stations of the apparatus are manually accessible from a single side of the apparatus.

15. The apparatus of claim 1 wherein the processing station includes a support movably positioned proximate to the vessel and configured to carry the microelectronic workpiece, the support being moveable between a first transferring position and a second transferring position spaced apart from the first transferring position, wherein the support is oriented to receive the microelectronic workpiece from the transfer device when the support is in the first transferring position, and wherein the support is oriented to receive the microelectronic workpiece manually from the user when the support is in the second transferring position, the support being configured to selectively stop its motion at the first and second transferring positions.

16. The apparatus of claim 1 wherein the processing station is one of a plurality of processing stations and includes a first application station configured to enhance and/or repair a seed layer of the microelectronic workpiece, and wherein at least one of the processing stations includes a material removal station, further wherein at least another of the processing stations includes a second application station configured to apply a blanket layer of conductive material to the microelectronic workpiece, still further wherein at least another of the processing stations includes a thermal processing station configured to anneal a conductive material of the microelectronic workpiece.

17. The apparatus of claim 1 wherein the processing station is one of a plurality of processing stations and is configured to electrophoretically deposit an electrophoretic resist material on the microelectronic workpiece, and wherein at least one of the processing stations includes a thermal processing station having a heater and being configured to receive the microelectronic workpiece with the electrophoretic resist material and elevate a temperature of the electrophoretic resist material, and wherein at least another of the processing stations includes a spray station having a spray vessel configured to carry a spray fluid, a spray support positioned proximate to the spray vessel and configured to carry the microelectronic workpiece, and a spray fluid manifold positioned within the spray vessel, the spray fluid manifold being coupleable to a source of spray fluid, the spray fluid manifold having a plurality of fluid jets directed toward the support to spray the microelectronic workpiece with the spray fluid.

* * * * *